(12) United States Patent
Pelleymounter

(10) Patent No.: US 12,112,931 B2
(45) Date of Patent: *Oct. 8, 2024

(54) DUAL REVERSE PULSE SPUTTERING SYSTEM

(71) Applicant: Advanced Energy Industries, Inc., Fort Collins, CO (US)

(72) Inventor: Doug Pelleymounter, Northfield, MN (US)

(73) Assignee: Advanced Energy Industries, Inc., Denver, CO (US)

( * ) Notice: Subject to any disclaimer, the term of this patent is extended or adjusted under 35 U.S.C. 154(b) by 702 days.

This patent is subject to a terminal disclaimer.

(21) Appl. No.: 17/335,011

(22) Filed: May 31, 2021

(65) Prior Publication Data

US 2021/0287888 A1  Sep. 16, 2021

Related U.S. Application Data

(63) Continuation of application No. 15/844,438, filed on Dec. 15, 2017, which is a continuation-in-part of (Continued)

(51) Int. Cl.
*H01J 37/34* (2006.01)
*C23C 14/34* (2006.01)
(Continued)

(52) U.S. Cl.
CPC ...... *H01J 37/3476* (2013.01); *C23C 14/3485* (2013.01); *C23C 14/35* (2013.01);
(Continued)

(58) Field of Classification Search
CPC ............... H01J 37/3476; H01J 37/3405; H01J 37/3438; H01J 37/3444; H01J 37/3467;
(Continued)

(56) References Cited

U.S. PATENT DOCUMENTS

| | | | |
|---|---|---|---|
| 4,478,700 A | 10/1984 | Criss | |
| 4,693,805 A | 9/1987 | Quazi | |

(Continued)

FOREIGN PATENT DOCUMENTS

| | | |
|---|---|---|
| CN | 102985996 A | 3/2013 |
| CN | 103668095 A | 3/2014 |

(Continued)

OTHER PUBLICATIONS

Notice of Reasons for Rejection received for Chinese Patent Application Serial No. 201880089409.1 dated Mar. 8, 2022, 10 pages.

(Continued)

*Primary Examiner* — John J Brayton
(74) *Attorney, Agent, or Firm* — Neugeboren O'Dowd PC

(57) ABSTRACT

A pulsed power system and a pulsed power sputtering system are disclosed. The pulsed power system includes a first power source that is configured to apply a first voltage at a first power lead that alternates between positive and negative relative to a second power lead during each of multiple cycles. A second power source is coupled to a third power lead and the second power lead, and the second power source is configured to apply a second voltage to the third power lead that alternates between positive and negative relative to the second power lead during each of the multiple cycles. A controller is configured to control the first power source and the second power source to phase-synchronize the first voltage with the second voltage, so both, the first voltage and the second voltage, are simultaneously negative during a portion of each cycle and simultaneously positive relative to the second power lead during another portion of each cycle.

13 Claims, 16 Drawing Sheets

Related U.S. Application Data application No. 15/802,791, filed on Nov. 3, 2017, now Pat. No. 10,910,203, which is a continuation of application No. 14/697,267, filed on Apr. 27, 2015, now Pat. No. 9,812,305.

(51) Int. Cl.
   *C23C 14/35* (2006.01)
   *C23C 14/56* (2006.01)
   *C23C 14/08* (2006.01)

(52) U.S. Cl.
   CPC .......... *C23C 14/352* (2013.01); *C23C 14/562* (2013.01); *H01J 37/3405* (2013.01); *H01J 37/3438* (2013.01); *H01J 37/3444* (2013.01); *H01J 37/3467* (2013.01); *C23C 14/083* (2013.01); *H01J 2237/2485* (2013.01); *H01J 2237/327* (2013.01); *H01J 2237/332* (2013.01)

(58) Field of Classification Search
   CPC ... C23C 14/3485; C23C 14/34; C23C 14/352; C23C 14/562
   See application file for complete search history.

(56) References Cited

U.S. PATENT DOCUMENTS

| | | | |
|---|---|---|---|
| 5,427,669 A | 6/1995 | Drummond | |
| 5,777,863 A * | 7/1998 | Kowalevskii | H01J 37/3444 363/63 |
| 5,897,753 A | 4/1999 | Schatz et al. | |
| 6,005,218 A | 12/1999 | Walde et al. | |
| 6,063,245 A | 5/2000 | Frach et al. | |
| 6,183,605 B1 | 2/2001 | Schatz et al. | |
| 6,222,321 B1 | 4/2001 | Scholl et al. | |
| 6,338,777 B1 | 1/2002 | Longstreth White | |
| 6,340,416 B1 | 1/2002 | Goedicke et al. | |
| 9,812,305 B2 | 11/2017 | Pelleymounter | |
| 10,373,811 B2 * | 8/2019 | Christie | H01J 37/3438 |
| 10,910,203 B2 * | 2/2021 | Pelleymounter | H01J 37/3438 |
| 11,049,702 B2 * | 6/2021 | Pelleymounter | H01J 37/3405 |
| 2003/0209423 A1 * | 11/2003 | Christie | H01J 37/3405 204/192.12 |
| 2004/0075060 A1 | 4/2004 | Luten et al. | |
| 2006/0278518 A1 | 12/2006 | Kouznetsov | |
| 2009/0205954 A1 | 8/2009 | Hanika et al. | |
| 2010/0196624 A1 | 8/2010 | Ruuttu et al. | |
| 2010/0236919 A1 | 9/2010 | Alami et al. | |
| 2010/0276283 A1 | 11/2010 | Muenz et al. | |
| 2011/0120860 A1 | 5/2011 | Horishita et al. | |
| 2011/0180389 A1 | 7/2011 | Cremer et al. | |
| 2011/0248633 A1 | 10/2011 | Nauman et al. | |
| 2014/0234616 A1 | 8/2014 | Hultman et al. | |
| 2016/0314946 A1 | 10/2016 | Pelleymounter | |
| 2017/0022604 A1 | 1/2017 | Christie et al. | |
| 2018/0108520 A1 | 4/2018 | Pelleymounter | |
| 2021/0111010 A1 | 4/2021 | Pelleymounter | |

FOREIGN PATENT DOCUMENTS

| | | |
|---|---|---|
| DE | 102009051056 A1 | 5/2011 |
| EP | 0692138 B1 | 1/2004 |
| EP | 1458006 A1 | 9/2004 |
| EP | 2439763 A2 | 4/2012 |
| EP | 2784799 A1 | 10/2014 |
| EP | 3089196 A1 | 11/2016 |
| JP | H0397846 A | 4/1991 |
| JP | 2009-284733 A | 12/2009 |
| WO | 02103078 A1 | 12/2002 |
| WO | 2007051461 A1 | 5/2007 |
| WO | 2009040406 A2 | 4/2009 |
| WO | 2009131737 A1 | 10/2009 |

OTHER PUBLICATIONS

Notice of Reasons for Rejection received for Japanese Patent Application Serial No. 2020552669 dated Dec. 13, 2021, 6 pages (Including English Translation).
Hochstrasser, M, "Extended European Search Report Regarding Application No. 18889771.4", Sep. 7, 2021, p. 9, Published in: EP.
Advanced Energy Industries, Inc., "Enhanced Plasma Containment for Inline Sputtering Systems", Jun. 18, 2008, p. 4, Published in: US.
SIPO, "Office Action Regarding Chinese Patent Application No. 201680003857.6", Dec. 26, 2018, p. 15, Published in: CN.
SIPO, "Office Action Regarding Application No. 201610490917.3", May 7, 2019, p. 14, Published in: CN.
SIPO, "Office Action Regarding Chinese Application No. 201610490917.3", Mar. 9, 2020, p. 11, Published in: CN.
Brayton, John Joseph, "Office Action Regarding U.S. Appl. No. 15/844,438", Jan. 7, 2021, p. 48, Published in: US.
Anonymous, "PCT Third Party Observation Regarding International Application No. PCT/US2018/016223", Mar. 24, 2020, p. 7, Published in: PCT.
European Patent Office, "Office Action Regarding European Patent Application No. 18889771.4", Jul. 22, 2020, p. 3, Published in: EP.
Wittman-Regis, Agnes, "International Preliminary Report On Patentability Regarding International Application No. PCT/US2018/016223", Jun. 25, 2020, p. 10, Published in: CH.
Brayton, John Joseph, "Office Action Regarding U.S. Appl. No. 15/802,791", Mar. 30, 2020, p. 36, Published in: US.
Hochstrasser, M, "Office Action Regarding European Patent Application No. 18 158 711.4", Jul. 3, 2020, p. 5, Published in: EP.
Hochstrasser, M, "European Search Report Re Application No. EP18158711", May 17, 2018, Published in: EP.
M. Hochstrasser, "Extended European Search Report Re Application No. 16831032.4", Feb. 20, 2018, p. 6, Published in: EPO.
Weekes, Chris, "International Search Report and Written Opinion re Application No. PCT/US2016/042389", Oct. 20, 2016, p. 11, Published in: AU.
Timon Wanga, "United State Final Office Action Re U.S. Appl. No. 14/809,084", Mar. 27, 2018, p. 11, Published in: US.
Berman, Jason, "Office Action Regarding U.S. Appl. No. 14/809,084", Aug. 10, 2018, p. 14, Published in: US.
Wanga, Timon, "United States Office Action Re U.S. Appl. No. 14/809,084", Sep. 22, 2017, p. 20, Published in: US.
Andrew Rapson, "International Search Report Re Application No. PCT/US2018/016223", May 7, 2018, p. 15, Published in: AU.
Aguilar, Maria, "European Search Report Re Application No. EP16165652", Aug. 18, 2016, p. 2, Published in: EP.
Wanga, Timon, "United States Office Action Re U.S. Appl. No. 14/697,267", Jan. 25, 2017, p. 18, Published in: US.
Advanced Energy, "Ascent DMS Advanced Dual-Magnetron Sputtering Accessories", 2018, p. 8, Published in: US.
Pelleymounter, D.R., "Raising the Bar On Reactive Deposition Sputter Rates", 58th Annual Technical Conf Proceedings, Apr. 28, 2015, pp. 218-222, Publisher: Society of Vacuum Coaters, Published in: US.
Scholl, R., "Redundant Anode Sputtering: A Novel Approach To The Disapperaing Anode Problem", Retrieved from http://www.advanced-energy.com/upload/File/White_Papers/SL-WHITE2-270-01.pdf, Jan. 1, 2000, p. 8.
Society of Vacuum Coaters, "List of Abstracts for SVC Technical Program: Apr. 27-30, SVC 58th Annual Technical Conference Proceedings", Apr. 27, 2015, p. 58, Published in: US.
Notice of Grounds for Rejection received for Korean Patent Application No. 10-2020-7020262 dated Oct. 4, 2022, Korean Intellectual Property Office, Korea, 8 pages (English Translation).

* cited by examiner

DUAL REVERSE PULSE SPUTTERING SYSTEM

CLAIM OF PRIORITY UNDER 35 U.S.C. § 120

The present application for patent is a continuation of U.S. patent application Ser. No. 15/844,438 entitled "Rate Enhanced Pulsed DC Sputtering System" filed Dec. 15, 2017, which is a continuation-in-part of U.S. patent application Ser. No. 15/802,791 entitled "Rate Enhanced Pulsed DC Sputtering System," filed Nov. 3, 2017 and issued as U.S. Pat. No. 10,910,203, which is a continuation of U.S. patent application Ser. No. 14/697,267, entitled "Rate Enhanced Pulsed DC Sputtering System," filed Apr. 27, 2015 and issued as U.S. Pat. No. 9,812,305 on Nov. 7, 2017. U.S. patent application Ser. No. 15/844,438; U.S. Pat. Nos. 10,910,203; and 9,812,305 are assigned to the assignee hereof and expressly incorporated by reference herein.

FIELD

The present invention relates generally to sputtering systems, and more specifically to pulsed DC sputtering.

BACKGROUND

Sputtering historically includes generating a magnetic field in a vacuum chamber and causing a plasma beam in the chamber to strike a sacrificial target, thereby causing the target to sputter (eject) material, which is then deposited as a thin film layer on a substrate, sometimes after reacting with a process gas. Sputtering sources may employ magnetrons that utilize strong electric and magnetic fields to confine charged plasma particles close to the surface of the target. An anode is generally provided to collect electrons from the plasma to maintain plasma neutrality as ions leave to bombard the target.

The industry has evolved over the years in various attempts to maximize sputtering efficiency, decrease power consumption requirements, minimize the heat load of the system, minimize arcing and/or increase the types of substrates that may be used in the system.

Moreover, sputtering a thin film of, for example, titanium dioxide ($TiO_2$) or silicon dioxide ($SiO_2$) onto a polyethylene substrate presents unique challenges in the industry because polyethylene is a plastic with a low melting point or low heat tolerance. Currently-available sputtering systems, whether DC or AC type systems, require a high heat load to effectuate sputtering and/or the deposition of $TiO_2$ or $SiO_2$, yet this high heat load, caused by a high current density, effectively eliminates polyethylene as a suitable substrate for many intended high power applications. Compounding the problem, if the heat load in the currently-available sputtering systems is lowered to a level that does not melt or otherwise render the polyethylene unsuitable, e.g., by reducing the power applied, the deposition rate is lowered to a point that results in a low-quality deposited layer and/or increases the required time for sputtering to a point that renders the use of polyethylene as a substrate infeasible from a commercial perspective.

There therefore remains a need for a device that provides improved sputtering deposition rates at a lower heat load.

SUMMARY

Embodiments disclosed herein address the above stated needs by providing a system, method, or non-transitory memory having instructions for pulsed direct current sputtering.

According to an aspect, a pulsed power system comprises a first power source coupled to a first power lead and a second power lead, the first power source configured to apply a first voltage at the first power lead that alternates between positive and negative relative to the second power lead during each of multiple cycles. The system also includes a second power source coupled to a third power lead and the second power lead, the second power source configured to apply a second voltage to the third power lead that alternates between positive and negative relative to the second power lead during each of the multiple cycles. A controller of the system is configured to control the first power source and the second power source to phase-synchronize the first voltage with the second voltage, so both, the first voltage and the second voltage, are simultaneously negative during a portion of each cycle and simultaneously positive relative to the second power lead during another portion of each cycle.

Other aspects include a non-transitory memory including non-transitory instructions. The non-transitory instructions are at least one of executable by a processor to execute a method and accessible by a field programmable gate array to configure the field programmable gate array to execute the method. The method includes causing a first power source to apply a first voltage between first power lead and a second power lead, wherein the first voltage at the first power lead alternates between positive and negative relative to the second power lead over multiple cycles. The method also includes causing a second power source to apply a second voltage between the third power lead and the second power lead, wherein the second voltage at the third power lead alternates between positive and negative relative to the second power lead in the plasma chamber over the multiple cycles. In addition, the first power source and the second power source are phase-synchronized so both, the first voltage and the second voltage are simultaneously negative and simultaneously positive relative to the second power lead over the multiple cycles.

Another aspect includes a pulsed sputtering system comprising a plasma chamber enclosing at least a first electrode, a second electrode, and a third electrode. The system also comprises means for applying a first voltage at the first electrode that alternates between positive and negative relative to the second electrode during each of multiple cycles and means for applying a second voltage to the third electrode that alternates between positive and negative relative to the second electrode during each of the multiple cycles. In addition, the system comprises means for phase-synchronizing the first voltage with the second voltage, so both, the first voltage and the second voltage are simultaneously negative during a portion of each cycle and simultaneously positive relative to the second electrode during another portion of each cycle, wherein the first voltage and the third voltage are simultaneously negative relative to the second electrode at least 70 percent of a time over the multiple cycles.

DETAILED DESCRIPTION

The word "exemplary" is used herein to mean "serving as an example, instance, or illustration." Any embodiment described herein as "exemplary" is not necessarily to be construed as preferred or advantageous over other embodiments. A "power cycle" is intended to reference a time period including a time of power having a voltage with a first polarity followed by a time of power having a voltage with a second polarity. Further, for the purpose of this disclosure, all terms, and particularly terms such as "simultaneously" and "equal to" are intended to mean "within the tolerances of process or manufacturing controls". For example, it will be understood that a synchronizing unit, such as unit 120, may not achieve perfect synchronization between the power sources 140, 142 described herein, and therefore the term "simultaneous(ly)" is to be understood as meaning "substantially simultaneous(ly)".

Figure 1:
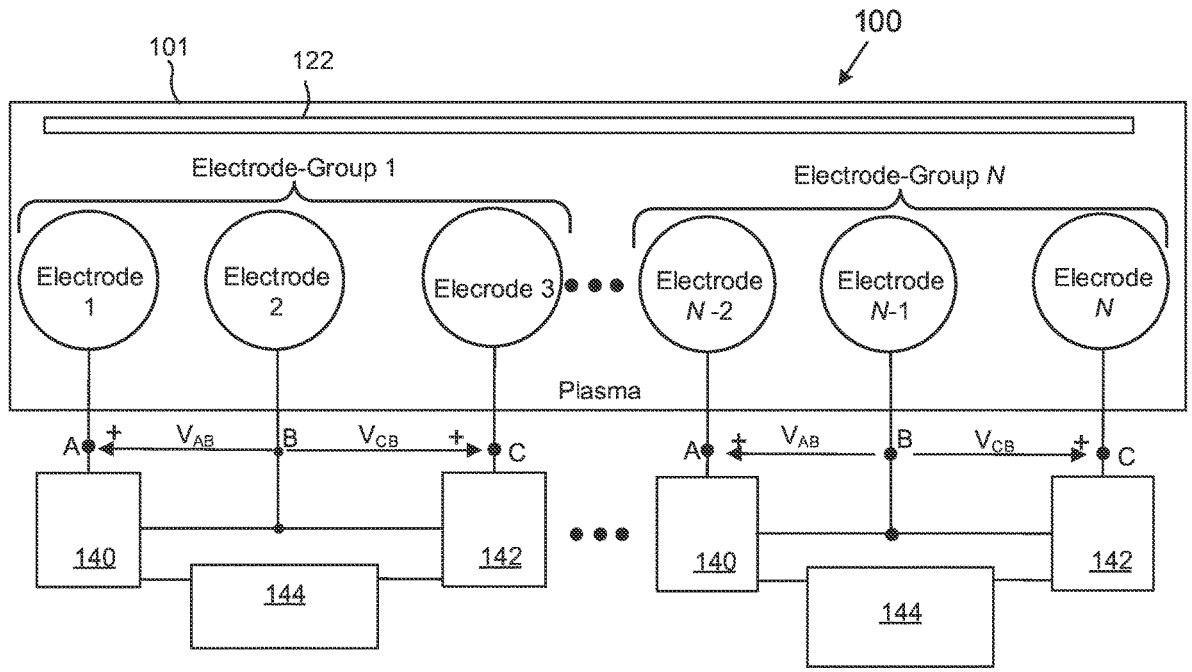
FIG. 1 depicts an embodiment of a sputtering system depicting aspects that are common to many implementations disclosed herein.

Referring to FIG. 1, an exemplary pulsed, direct current sputtering system 100 is shown. Generally stated, the system 100 provides an operator with the ability to achieve higher deposition rates as compared to prior AC dual magnetron and pulsed DC single magnetron sputtering approaches, by delivering higher power at a particular current. More specifically, at a particular power level, some embodiments of the system 100 disclosed herein may cut the RMS current in the endblocks or magnetrons by about half, as compared to prior AC sputtering systems. As a consequence, in cases in which the endblock current rating is limited, the system 100 may enable delivery of nearly twice the power while staying within the endblock current rating limit. Another aspect of the system depicted in FIG. 1 is that depending upon the type of electrodes that are utilized and the control scheme that is implemented, sputtering occurs at least 70% of the time. And in some implementations, the system 100 is capable of sputtering 80%, 90%, or up to nearly 100% of the time.

Additional aspects of the system 100 include a resultant reduction of heat load to the substrate, or a higher deposition rate at the same substrate heat load. Moreover, another aspect of many implementations is that substantially the same deposition rate (per total power (KW) delivered to the process) can be expected as compared to mid-frequency (MF)(AC or pulsed) dual magnetron sputtering. As discussed herein, the voltage in each cycle may reverse 100%. And beneficially, some implementations operate while producing undetectable anode material levels in a film on the substrate.

The system 100 may be used by web coaters, who have in the past struggled with maintaining the sputtering process at manageable temperatures throughout production runs (e.g., of over 7 days), to improve deposition rates and quality. In currently-available systems, web coaters apply ventilation to plasma chambers to reduce the heat, which increases the production rate by 35% as compared to systems without ventilation. The system 100 presently disclosed provides, in contrast, a doubling of the production rate before cooling is even applied. That is, the system 100 and/or the methods disclosed herein may lower the heat load or heating experienced by the substrate 122, even under application of the same power, and may be practiced to apply a high-quality layer of material, such as silicon dioxide ($SiO_2$) or titanium dioxide ($TiO_2$), onto a polyethylene substrate, without destroying the polyethylene substrate, and in a shortened period of time as compared to those realized in currently-available systems. The $SiO_2$ or $TiO_2$ layer may be thicker than what may be realized in currently-available designs.

The system 100 may provide about 2 times the deposition rate of AC dual magnetron or bi-polar pulsed DC sputtering, with half the heat load experienced in the currently-available sputtering systems.

As shown in FIG. 1, the system 100 includes a plasma chamber 101 enclosing at least a first electrode, a second electrode, and a third electrode. The system 100 includes a substrate 122 upon which the system 100 deposits a thin film material in a sputtering process. As shown in FIG. 1, the system 100 includes at least three electrodes, but may include N electrodes, and in the present embodiment, the electrodes are depicted in groups of three for ease of description.

More specifically, in the depicted embodiment, there are a first group (shown as "electrode-group 1") of three electrodes, which includes electrode 1, electrode 2, and electrode 3, and another group (shown as electrode-group N) of three electrodes, which includes electrode N-2, electrode N-1, and electrode N. In some variations, only one group of three electrodes may be implemented. In other variations two groups (of three electrodes) are implemented, and in yet other embodiments, more than two groups (of three electrodes) are implemented.

As shown, relative to each group of electrodes, a first power source 140 is coupled to the first electrode (electrode 1 in electrode-group 1 and electrode N-2 in electrode-group N) and the second electrode (electrode 2 in electrode-group 1 and electrode N-1 in electrode-group N). The first power source 140 is configured to apply a first voltage $V_{AB}$ at the first electrode that alternates between positive and negative relative to the second electrode during each of multiple cycles. A second power source 142 is coupled to the third electrode (electrode 3 in electrode-group 1 and electrode N in electrode-group N) and the second electrode.

The second power source 142 is configured to apply a second voltage $V_{CB}$ to the third electrode that alternates between positive and negative relative to the second electrode during each of the multiple cycles. As shown, a controller 144 is configured to control the first power source 140 and the second power source 142 to phase-synchronize the first voltage with the second voltage, so both, the first voltage $V_{AB}$ and the second voltage $V_{CB}$, are simultaneously negative during a portion of each cycle and simultaneously positive relative to the second electrode during another portion of each cycle.

As discussed further herein, each of the first and second power sources 140, 142 may include a bi-polar controllable pulsed DC power supply to apply the first voltage $V_{AB}$ and second voltage $V_{CB}$. And as discussed in more detail further herein, the controller 144 may be realized by hardware, firmware or a combination of software and hardware and/or hardware and firmware. It is also contemplated, as discussed further herein, that each controller 144 may be coupled to one or more other controllers 144 so that inter-electrode-group voltages are phase synchronized. Moreover, arc management synchronization may be implemented so that a detected arc in the plasma prompts all the power sources 140, 142 to stop applying power to the electrodes.

Figure 2:
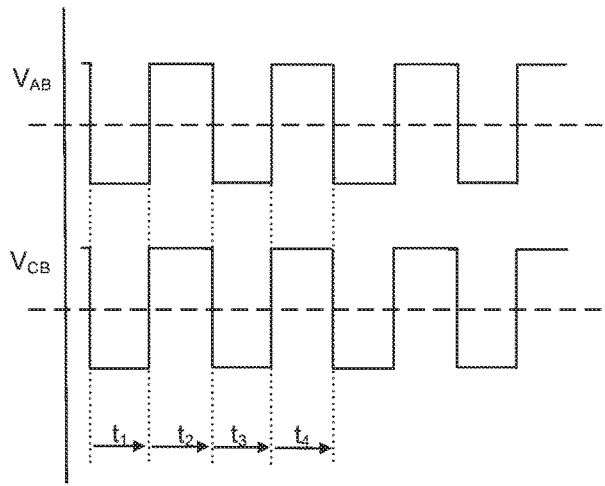
FIG. 2 is a timing diagram depicting exemplary voltages applied to the electrodes of FIG. 1 over time.

Referring to FIG. 2 shown is a timing diagram depicting an exemplary first voltage $V_{AB}$ and an exemplary second voltage $V_{CB}$ that may be applied by the first power source 140 and the second power source 142 to the first and third electrodes, respectively, (relative to the second electrode) of FIG. 1 over time. Also shown are times $t_1$, $t_3$, during which the first and third electrodes may sputter (if implemented as magnetrons) while the second electrode operates as an anode. And at times $t_2$, $t_4$ the second electrode may sputter (if implemented as a magnetron) while the first and third electrodes function as anodes.

Figure 3:
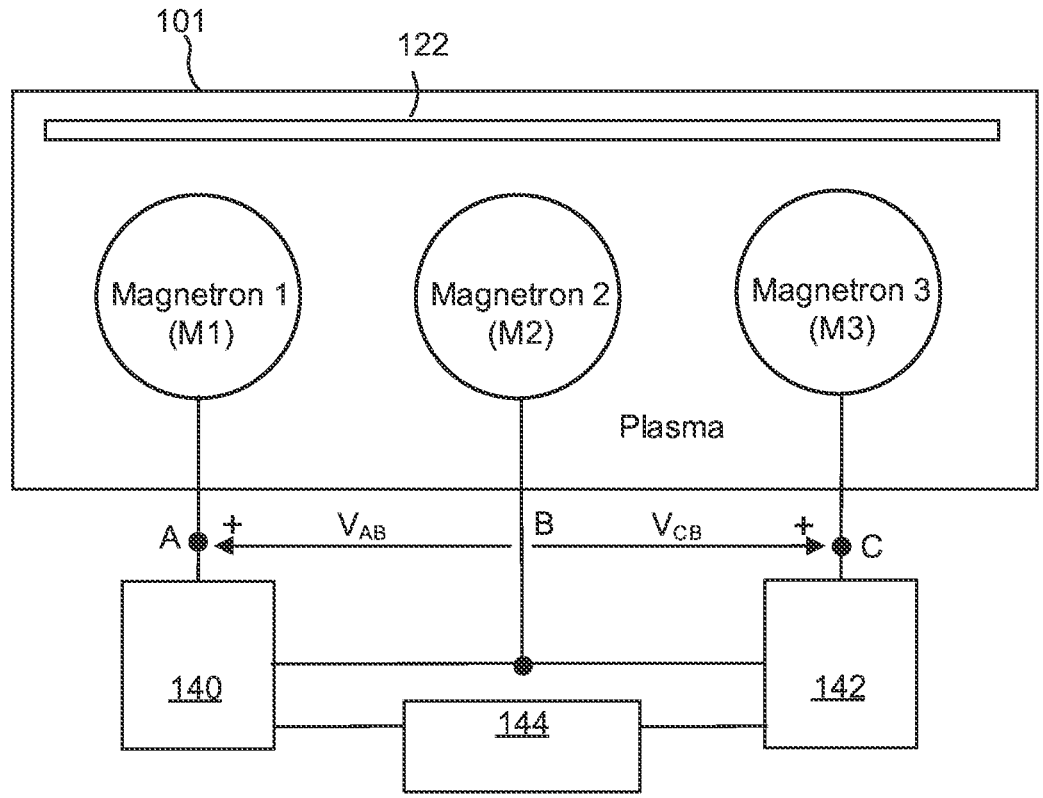
FIG. 3 is a diagram depicting a sputtering system including three magnetrons.

Referring to FIG. 3, shown is an implementation of the embodiment depicted in FIG. 1 in which three magnetrons are utilized to implement the N electrodes depicted in FIG. 1 to form a first magnetron M1, a second magnetron M2, and a third magnetron M3 wherein each of the three magnetrons is coupled to a corresponding one of three targets (not shown). The magnetrons M1, M2, M3 may be realized by magnetrons well known to those of ordinary skill in the art that operate as cathodes and are coupled to a target to enable the target material to be sputtered to the substrate 122 when bombarded by ions in the plasma chamber 101.

Figure 4:
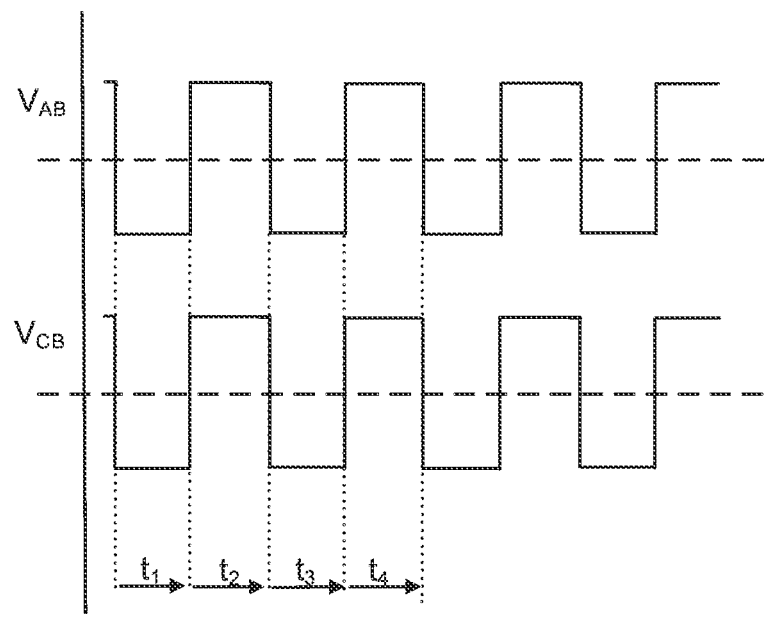
FIG. 4 is a timing diagram depicting exemplary voltages applied to the magnetrons of FIG. 3 over time.

As shown in FIG. 4, which is a timing diagram depicting exemplary voltages applied to the magnetrons of FIG. 3 over time, the controller 144 is configured to control the first power source 140 and the second power source 142, so both, the first voltage $V_{AB}$ at the first magnetron and the second voltage $V_{CB}$ at the third magnetron are simultaneously negative relative to the second magnetron at least 66 percent of a time over the multiple cycles. As shown, at times t1 and t3 the first and third magnetrons M1 and M3 sputter while magnetron M2 functions as anode, and at times t2 and t4, M2 sputters while magnetrons M1 and M3 function as anodes. Thus, during one half of each cycle, ⅔ of the magnetrons are sputtering and during another half of each cycle, ⅓ of the magnetrons M1, M2, and M3 are sputtering.

In the implementation depicted in FIG. 4, there may be a high level (e.g., twice the level) of power for half a cycle (e.g., during time t2) applied to magnetron M2 than magnetrons M1 and M3. That is, there will be twice the power at magnetron M2 in a very short period of time. In other words, a magnitude of power is effectively pulsed over time when switching between magnetrons (e.g., when switching from time $t_1$ to t2).

Figure 5:
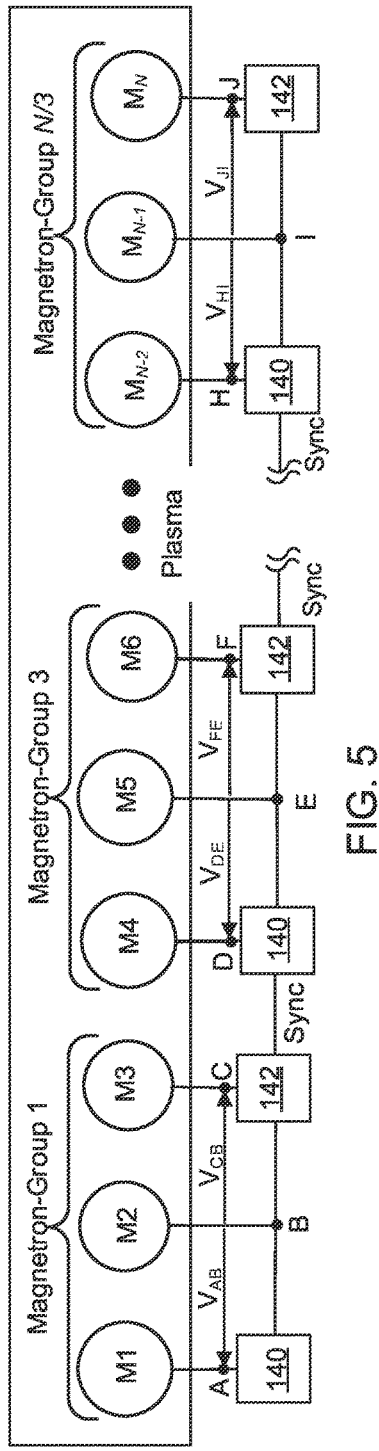
FIG. 5 is a diagram depicting extensibility of the implementation depicted in FIG. 3.

Referring next to FIG. 5, shown is an implementation of the embodiment depicted in FIG. 1 in which the arrangement of three magnetrons depicted in FIG. 2 is repeated so N/3 groups of magnetrons (where each magnetron-group includes three magnetrons powered by two power sources 140, 142) is duplicated to form N total magnetrons where N is evenly divisible by 3. As shown, each of the first power source 140 and the second power source 142 may be synchronized by intercommunication between the power sources 140, 142 as discussed further herein with reference to FIG. 11. When synchronized, a first voltage ($V_{AB}$, $V_{DE}$, $V_{HI}$) is applied between a first magnetron (M1, M4, $M_{N-2}$) in a group relative a second magnetron (M2, M5, $M_{N-1}$) in the same group. And a second voltage ($V_{CB}$, $V_{FE}$, $V_{JI}$) in a group is applied between a third magnetron (M3, M6, $M_N$) in the group relative to the corresponding second magnetron (M2, M5, $M_{N-1}$) in the group.

Figure 6:
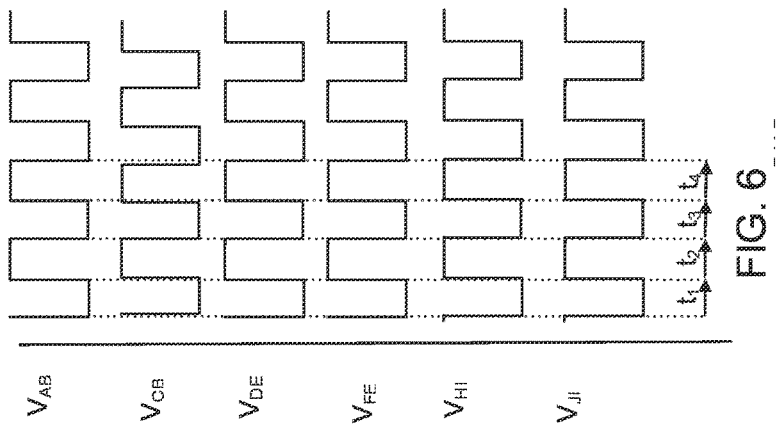
FIG. 6 is a timing diagram depicting exemplary voltages applied to the magnetrons of FIG. 5 over time.

Referring to FIG. 6, shown is a timing diagram depicting exemplary voltages applied to the magnetrons of FIG. 5 over time. As shown, at times $t_1$ and t3, ⅔ of the N magnetrons are sputtering. Specifically, M1, M3, M4, M6, $M_{N-2}$, and $M_N$ sputter at times $t_1$ and $t_3$ while magnetrons M2, M5, and $M_{N-1}$ function as an anode. And at times $t_2$ and $t_4$, ⅓ of the N magnetrons are sputtering. Specifically, M2, M5, and $M_{N-1}$ sputter during times $t_2$ and $t_4$ while magnetrons M1, M3, M4, M6, $M_{N-2}$, and $M_N$ function as anodes. The system depicted in FIG. 6 enables sputtering to occur during the entire cycle where ⅔ of the magnetrons sputter during a first part of each cycle and ⅓ of the magnetrons sputter during the other part of each cycle.

Figure 7:
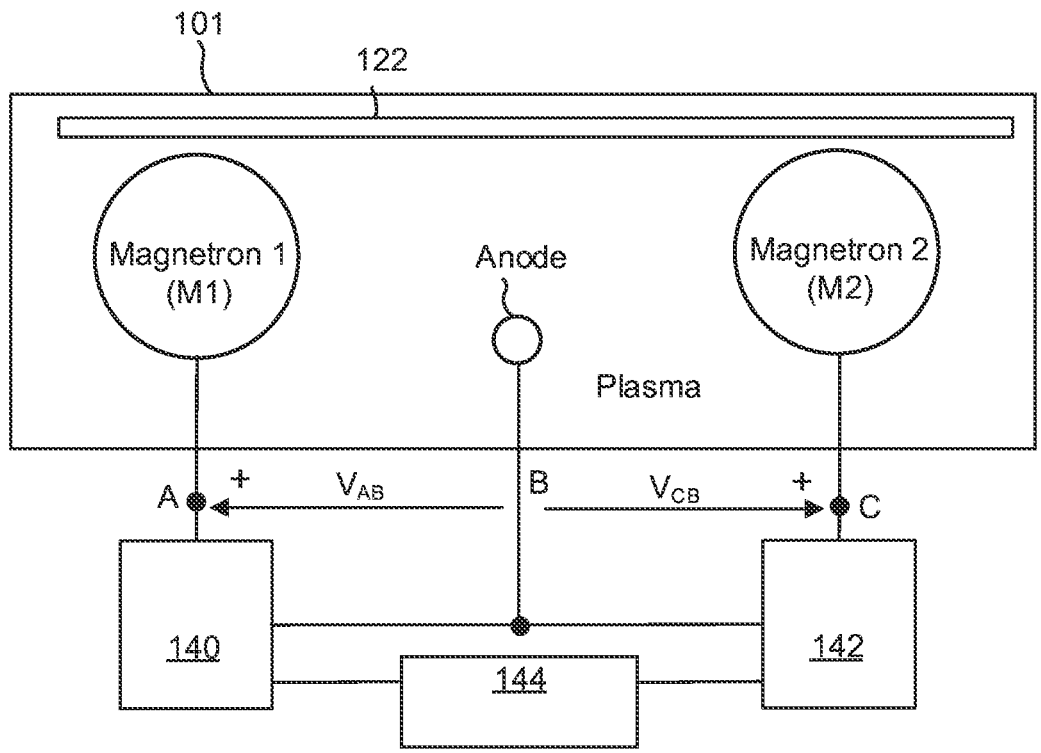
FIG. 7 is a diagram depicting a sputtering system including two magnetrons and an anode.

Referring next to FIG. 7, shown is a pulsed sputtering system where three electrodes of the sputtering system depicted in FIG. 1 are implemented by a first magnetron M1, a shared anode, and a second magnetron M2. The first power source 140 is coupled to the first magnetron M1 and the anode, and the first power source 140 is configured to apply a first voltage $V_{AB}$ at the first magnetron M1 that alternates between positive and negative relative to the anode during each of multiple cycles. The second power source 142 is coupled to the second magnetron M2 and the anode, and the second power source 142 is configured to apply a second voltage $V_{CB}$ to the second magnetron M2 that alternates between positive and negative relative to the anode during each of the multiple cycles. The controller 144 is configured to control the first power source 140 and the second power source 142 to phase-synchronize the first voltage $V_{AB}$ with the second voltage $V_{CB}$, so both, the first voltage $V_{AB}$ and the second voltage $V_{CB}$ are simultaneously negative during a portion of each cycle and simultaneously positive relative to the anode during another portion of each cycle. In many variations of the implementation in FIG. 7, the shared anode is cooled (e.g., by water cooling).

Figure 8:
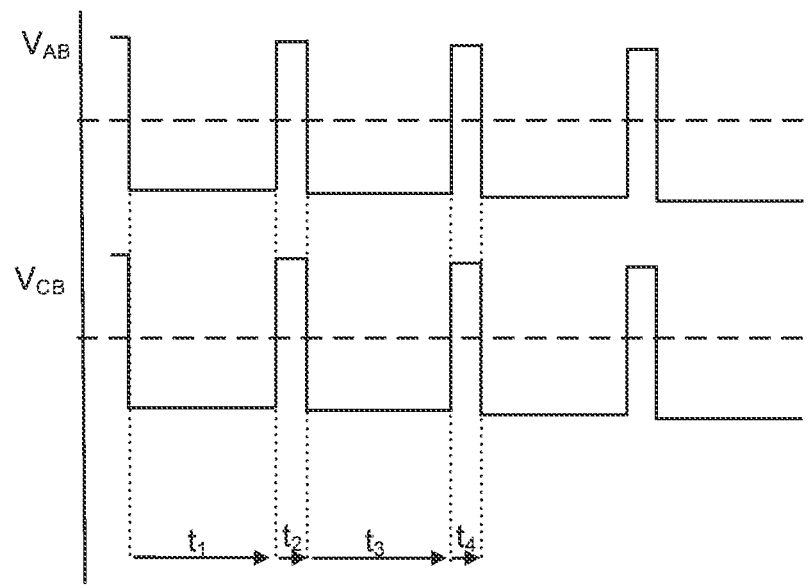
FIG. 8 is a timing diagram depicting exemplary voltages applied to the two magnetrons of FIG. 7 relative to the anode of FIG. 7 over time.

Referring to FIG. 8, shown is a timing diagram depicting exemplary voltages applied to the two magnetrons of FIG. 7 relative to the anode of FIG. 7 over time. As shown, at times $t_1$ and $t_3$, magnetrons M1 and M2 are sputtering. And at times $t_2$ and $t_4$, the first and second magnetrons have a positive potential relative to a negative potential of the anode. As shown, a percentage of time the sputtering is occurring during each cycle (and hence, during the multiple cycles depicted in FIG. 8) is $(t_1)/(t_2)$, and this percentage in some implementations is at least 70% of the cycle, or in other implementations, the percentage is between 70% and 90% of the cycle. In yet other implementations, the percentage is between 80% and 90% of the cycle, or the percentage may be between 85% and 90% of the cycle. And in yet other implementations, the percentage may be 90% or greater.

Figure 9:
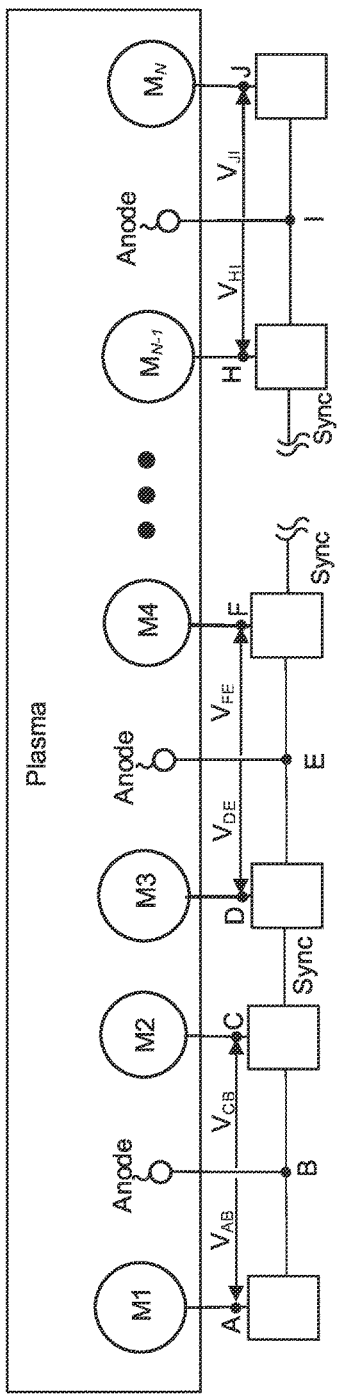
FIG. 9 is a diagram depicting extensibility of the implementation depicted in FIG. 7.

Referring next to FIG. 9, shown is an implementation where the electrode arrangement depicted in FIG. 7 is repeated so that a group of three electrodes (including two magnetrons and an anode) is duplicated to form N/3 groups for a total of N magnetrons and N/2 anodes. As shown, in each group of the three electrodes, a first voltage ($V_{AB}$, $V_{DE}$, $V_{HI}$) is applied between a first magnetron (M1, M3, $M_{N-1}$) in the group relative the anode in each group. And a second voltage ($V_{CB}$, $V_{FE}$, $V_{JI}$) in each group of three electrodes is applied a second magnetron (M2, M4, $M_N$) in the group relative to the corresponding anode in each group.

Figure 10:
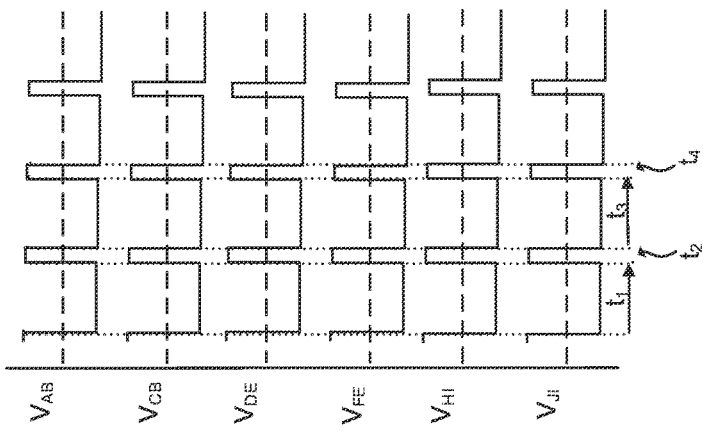
FIG. 10 is a timing diagram depicting exemplary voltages applied to the magnetrons of FIG. 9 relative to the anodes of FIG. 9 over time.

FIG. 10 depicts an exemplary timing of the first voltage ($V_{AB}$, $V_{DE}$, $V_{HI}$) in each group of electrodes and the second voltage ($V_{CB}$, $V_{FE}$, $V_{JI}$) in each of the groups of electrodes described with reference to FIG. 8. As shown, at times t1 and t3 all of the magnetrons M1 through $M_N$ are sputtering and at times t2 and t4 no sputtering is occurring. As the timing in FIG. 10 depicts, the first and second voltages are phase synchronized so both, the first voltage and the second voltage, are simultaneously negative during a portion of each cycle and simultaneously positive during another portion of each cycle.

Figure 11:
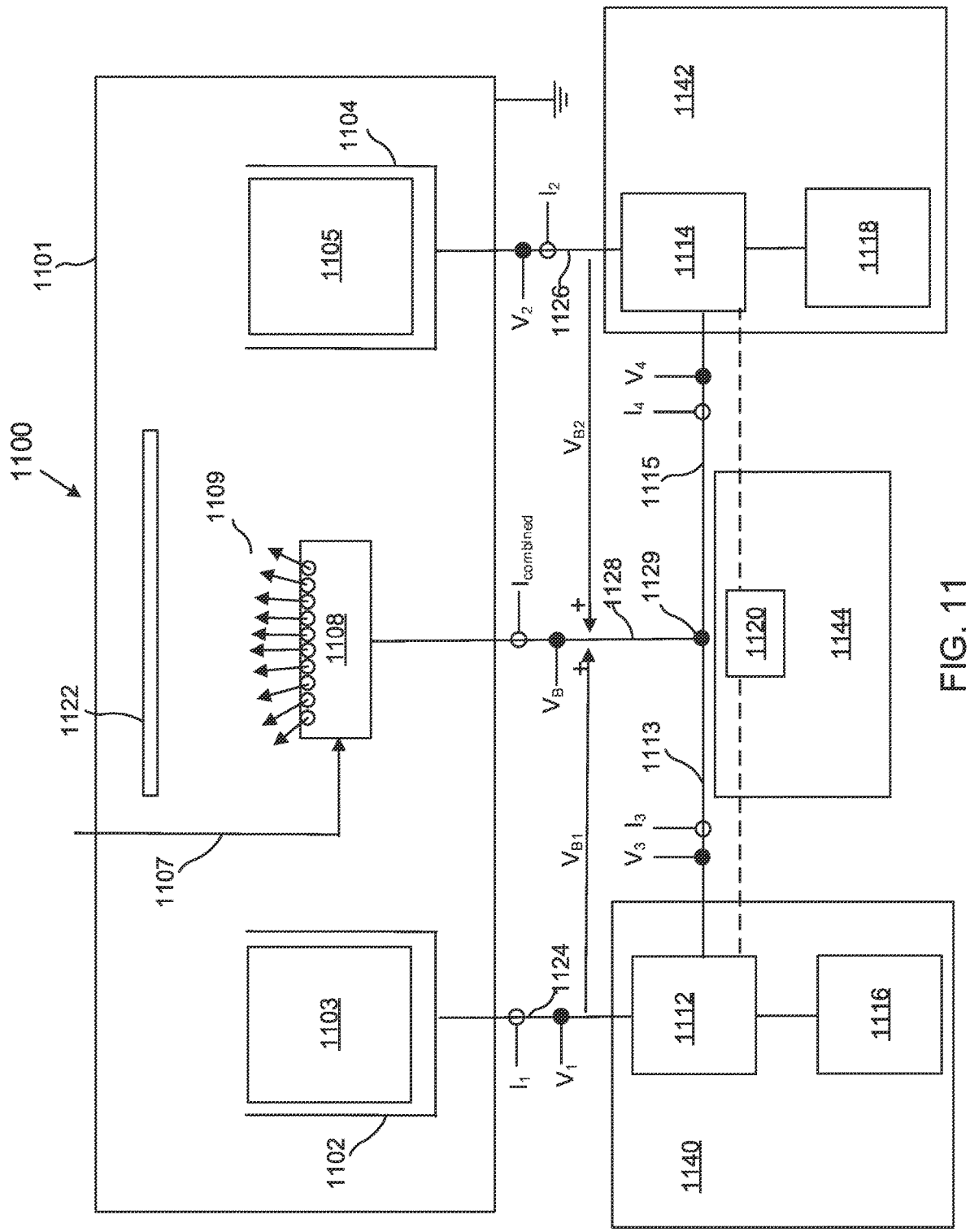
FIG. 11 is a block diagram illustrating additional aspects of a sputtering system that may be utilized in connection with the implementations described with reference to FIGS. 1-10.

Referring to FIG. 11, shown is a sputtering system 1100 depicting aspects that may be utilized in the various implementations (described with reference to FIGS. 2-10) of the general embodiment depicted in FIG. 1. As shown, the sputtering system 1100 may include a plasma chamber 1101 enclosing a first magnetron 1102 engaged with a first target 1103, a second magnetron 1104 engaged with a second target 1105, and an anode 1108. The system 1100 may include a substrate 1122 upon which the system 1100 is to deposit a thin film material in a sputtering process.

A first bi-polar controllable pulsed DC power supply 1112 (or first bi-polar DC supply 1112) and a second bi-polar controllable pulsed DC power supply 1114 (or second bi-polar DC supply 1114) may be provided. The first and second bipolar DC supplies 1112, 1114 may receive direct power from a first direct current (DC) supply 1116 and a second DC supply 1118, respectively. The first bi-polar DC supply 1112 may be coupled to the first magnetron 1102 by way of power lead(s) 1124, and configured to apply a sputtering power to the first target 1103. Similarly, the second bi-polar DC supply 1114 may be coupled to the second magnetron 1104, and configured to apply a sputtering power to the second target 1105. The first and second bi-polar DC supplies 1112, 1114 may be coupled to the anode 1108 by way of lead(s) 1128, and, more specifically, an electrical joint 1129 may couple a first anode lead 1113 from the first bi-polar DC supply 1112 to a second anode lead 1115 from the second bi-polar DC supply 1114. That is, the first power source 1140 may be operatively coupled to the anode 1108 and the first target 1103 by way of the first magnetron 1102 through leads 1124, 1113, and 1128, while the second power source 1142 may be operatively coupled to the anode 1108 and the second target 1105 by way of the second magnetron 1104 through leads 1126, 1115, and 1128.

In some embodiments, the anode may be the wall of the plasma chamber 1101; however, in others and as illustrated, the anode 1108 may be a floating anode 1108, and may further have a gas inlet 1107 and a plurality of gas outlets 1109 enabling the hollow cathode effect to aid in keeping the outlets clean for a more stable operation. Those of skill in the art will understand that, because the anode 1108 is a part of the power supply delivery circuit, gas entering at the inlet 1107 has an increased chance of breaking its bonds. For example, oxygen gas $O_2$ is more likely to break into two oxygen atoms as the gas exits the plurality of outlets 1109, while nitrogen gas $N_2$ is more likely to break into two nitrogen atoms as it exits the plurality of outlets 1109, resulting in films on the substrate 1122 that are of higher quality than would be expected without the use of an anode 1108 that provides a hollow cathode effect.

Some embodiments provide a system 1100 that maintains an anode that does not "disappear" as is known to occur in the prior art, and in the system disclosed herein, the anode 1108 may be kept clean or cleansed through operation at higher temperatures, by hollow cathode discharge in the plurality of outlets 1109, and/or by sputtering directly during an application of anode power.

In some embodiments, the system 1100 maintains the anode 1108, which may be a floating gas anode, at a relatively high temperature suitable for maintaining a clean anode, while not causing the heat load within the chamber 101 and/or experienced by the substrate 1122 to become so high as to damage the substrate 1122, such as a polyethylene substrate, therein. In some embodiments, the system 100 may maintain the anode 1108 at 100° Celsius, or more. In some embodiments, the system 100 may maintain the anode 1108 at a temperature of about 150° Celsius. In some embodiments, the system 1100 may maintain the anode 1108 at 150° Celsius or less, such as when in use by web coaters depositing titanium dioxide ($TiO_2$) or silicon dioxide ($SiO_2$) onto a polyethylene substrate. In some embodiments, the system 1100 may maintain the anode 1108 at 200° Celsius or more, such as when in use by glass coaters.

Continuing with FIG. 11, a controller 1144 comprising a synchronizing unit 1120 may synchronize power signals from the first and second bi-polar DC supplies 1112, 1114 in a manner that will be described in later portions of this document. In some embodiments, the first power source 1140 may comprise the first bi-polar controllable pulsed DC power supply 1112 and the first DC supply 1116. Similarly, the second power source may comprise the second bi-polar controllable pulsed DC power supply 1114 and the second DC supply 1118.

Of note, each of the first and second power supplies 1140, 1142 may be arranged and configured to be aware of the other one of the first and second power supplies 1140, 1142, without attempting to control the operation of the other one of the first and second power supplies 1140, 1142. Applicant has achieved this "awareness without control" by first configuring a frequency (e.g. 40 kHz) and duty of each of the first and second bi-polar DC supplies 1112, 1114, and subsequently coupling the synchronizing unit 1120 and configuring one of the first and second bi-polar DC supplies 1112, 1114 to be perceived as a transmitter for the purpose of frequency synchronization, and the other one of the first and second bi-polar DC supplies 1112, 1114 to be perceived as a receiver, for the purpose of frequency synchronization. In contrast, each one of the first and second DC supplies 1116, 1118 are independent, and do not rely on awareness of the other one of the first and second DC supplies 1116, 1118 to properly function.

Although not required, in one implementation, the first and second DC supplies 1116, 1118 may each be realized by one or more ASCENT direct current power supplies sold by Advanced Energy Industries, Inc. of Fort Collins, Colorado, U.S.A. And the first and second bi-polar DC supplies 1112, 1114 may each be realized by an ASCENT DMS Dual-magnetron sputtering accessory, which is also sold by Advanced Energy Industries, Inc. of Fort Collins, Colorado, U.S.A. In this implementation, the first and second power sources 1140, 1142 are each realized as an AMS/DMS stack wherein the ASCENT direct current power supply may provide straight DC power and perform arc management functions, and the DMS dual-magnetron sputtering accessory generates a pulsed DC waveform from the straight DC power. Beneficially, the DMS dual-magnetron sputtering accessories may be located in close proximity to the chamber 1101, and the ASCENT direct current power supplies may be located remotely (e.g., in a remote rack) from the chamber 1101. The 1120 synchronizing unit in this implementation may be realized by a common exciter (CEX) function of the DMS accessories.

In another embodiment, each of the first and second power sources 1140, 1142 may be realized by an integrated pulsed DC power supply.

Figure 12:
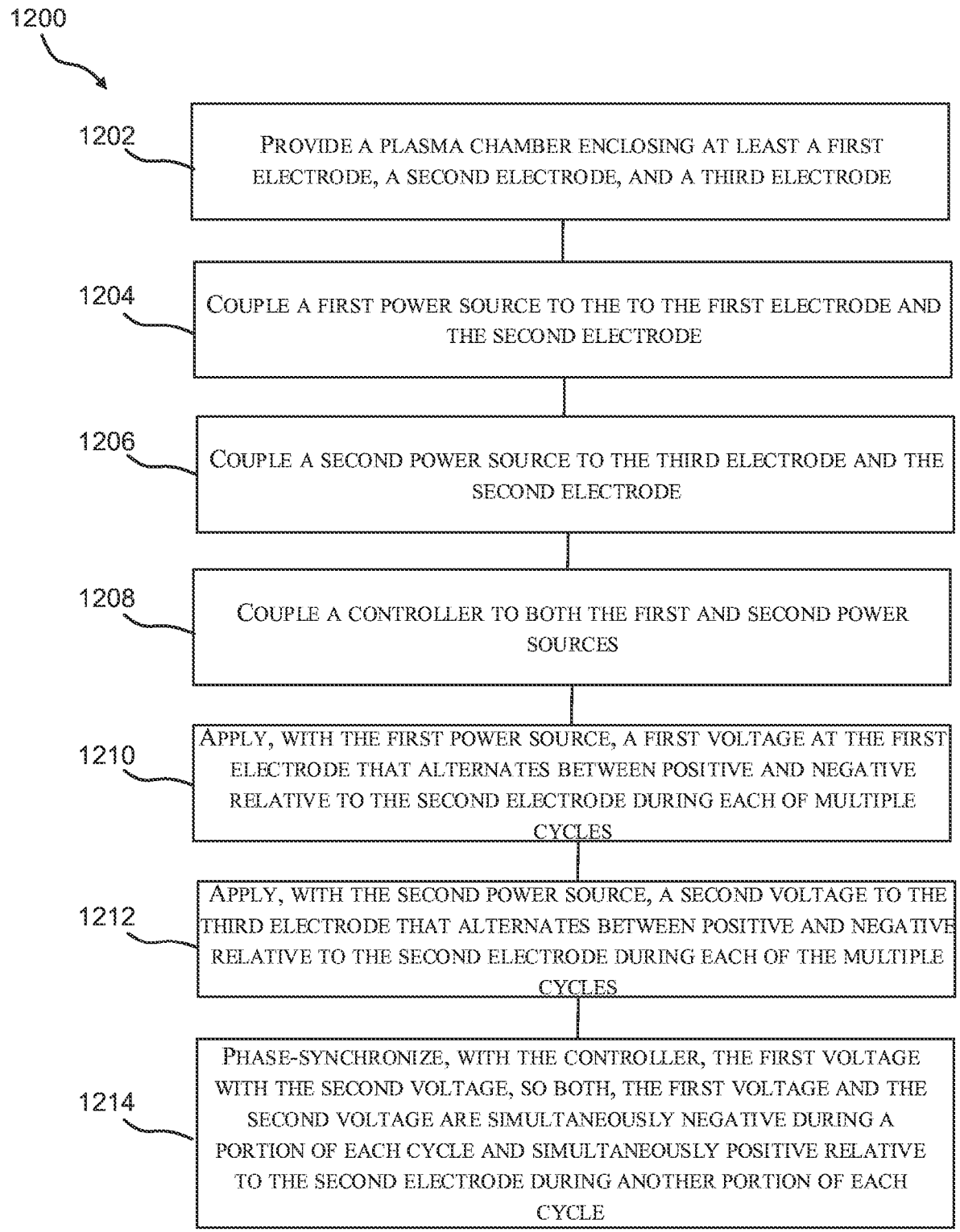
FIG. 12 is a flowchart depicting another method that may be traversed in connection with implementations described with reference to FIGS. 1 through 11.

Referring to FIG. 12, shown is a method that may be traversed in connection with the implementations disclosed herein. As shown, a plasma is provided in a plasma chamber enclosing at least a first electrode, a second electrode, and a third electrode (Block 1202). For example, the three electrodes may all be implemented as magnetrons, as described with reference to FIGS. 3-6, or the three electrodes may be implemented as two magnetrons in combination with an anode as described with reference to FIGS. 7-11.

As shown, a first power source is coupled to the first electrode and the second electrode, and a second power source is coupled to the third electrode and the second electrode (Blocks 1204 and 1206). In implementations where the three electrodes are implemented as two magnetrons in combination with an anode, the second electrode is implemented as the anode (e.g., without a target and without a magnetron). A controller is coupled to both the first and second power sources (Block 1208), and a first voltage is applied (e.g., with the first power source) at the first electrode that alternates between positive and negative relative to the second electrode during each of multiple cycles. In addition, a second voltage is applied to the third electrode (e.g., with the second power source) that alternates between positive and negative relative to the second electrode during each of the multiple cycles (Block 1210).

As shown, the first voltage is phase-synchronized with the second voltage, so both, the first voltage and the second voltage are simultaneously negative during a portion of each cycle and simultaneously positive relative to the second electrode during another portion of each cycle (Block 1214).

Figure 13:
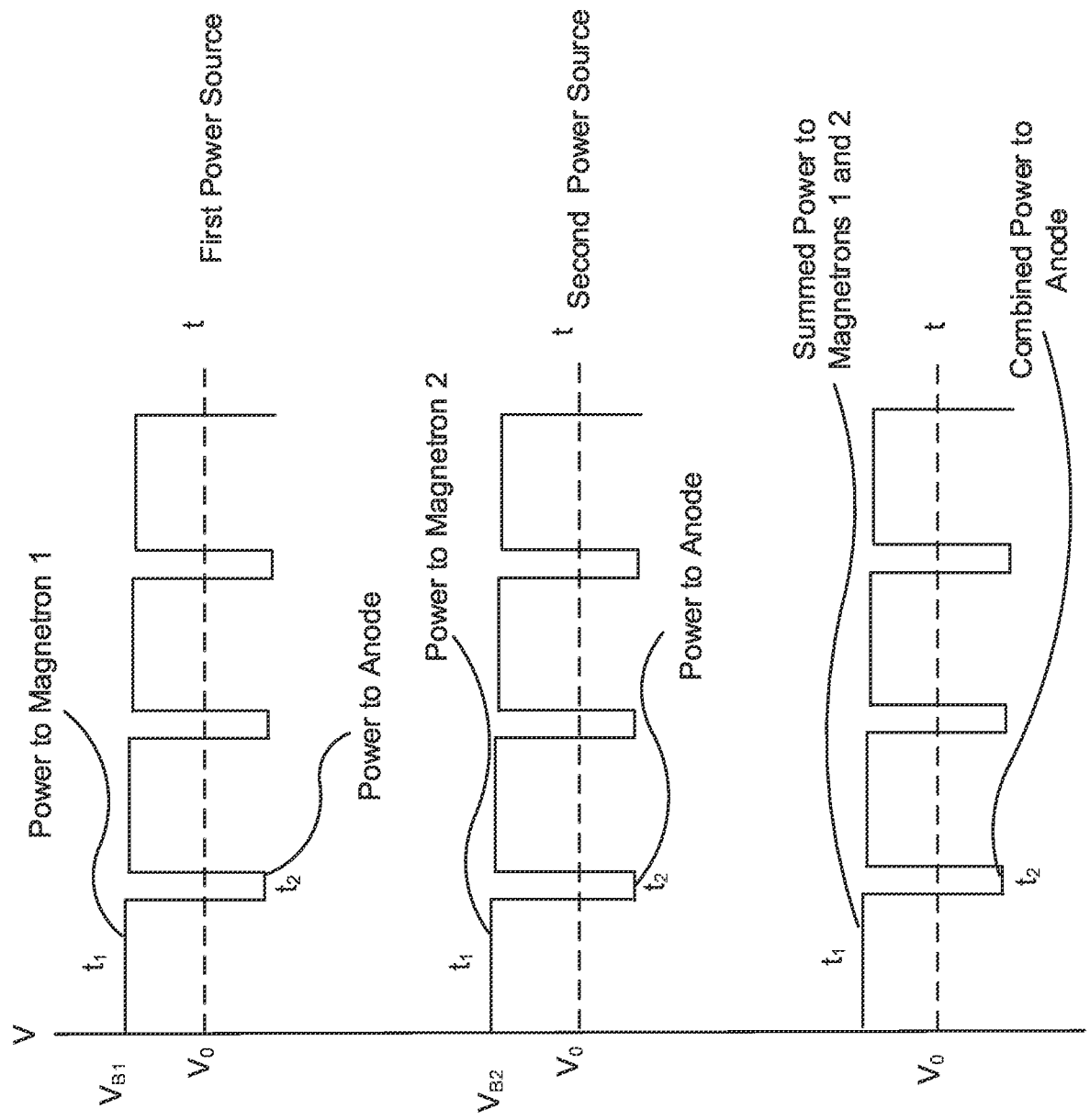
FIG. 13 is a graph of some aspects of power applications in the sputtering system of FIG. 11.

Referring next to FIG. 13, shown is a timing diagram depicting voltages applied in the system depicted in FIG. 11. It should be recognized that the point of reference in FIGS. 11 and 13 is the anode voltage $V_B$ relative to the voltages $V_1$ and $V_2$ at the magnetrons 1102 and 1104 (depicted in FIG. 11), respectively, which is opposite from the point of reference depicted in FIGS. 2, 4, 6, 8, and 10. As shown, in some embodiments, the controller 1144 and/or synchronizing unit 1120 may be configured to cause the first and second bi-polar DC supplies 1112, 1114 or first and second power sources 1140, 1142 to simultaneously apply sputtering power to the first and second magnetrons 1104, 1106, respectively, followed by a simultaneous anode power to the anode 1108.

Referring again to FIG. 11, the synchronizing unit 1120 may be configured to cause the first and second bi-polar DC supplies 1112, 1114 to apply power to the magnetrons 1104, 1106 for a first period of time $t_1$, followed by an application of power to the anode 1108 for a second period of time $t_2$, wherein the first period of time $t_1$ is 80% of a sputtering cycle comprising the first and second periods of time $t_1$, $t_2$. The second period of time $t_2$ may be about 20% of the cycle. In some variations, the first period of time $t_1$ may be at least 70% of the cycle, or, in other variations, between 70% and 90% of the cycle. The second period of time $t_2$ may be less than 30% of the cycle, or between 30% and 10% of the cycle. In some implementations, the first period of time $t_1$ may be between 80% and 90% of the cycle, and the second period of time $t_2$ may be between 20% and 10% of the cycle. In other implementations, the first period of time $t_1$ may be between 85% and 90% of the cycle, and the second period of time $t_2$ may be between 15% and 10% of the cycle.

As discussed further herein, the controller 1144 may be configured to control the first power source 1140 and the second power source 1142, and may have a non-transitory memory including non-transitory instructions to effectuate the methodologies described herein. For example, the non-transitory instructions may be accessible by a field programmable gate array to configure the field programmable gate array to execute one or more methods. In some embodiments, the non-transitory instructions are executable by a processor and/or accessible by the field programmable gate array to configure the field programmable gate array to execute one or more methods. In other embodiments, one or more aspects of the controller 1144 may be realized by hardware (e.g., application specific integrated circuits) that is persistently configured to control the first and second power sources 1140, 1142 to effectuate one or more of the methods described herein.

As shown in FIG. 13 certain novel and innovative aspects of a sputtering process that may be executed by the system 1100 are described in detail. As illustrated in FIG. 13, the system 1100 may be configured to apply a first power having a first voltage $V_{B1}$ between the anode and the first magnetron 1102 for a first period of time $t_1$. Simultaneously, or for the first period of time $t_1$, the system 1100 may apply a second power having a second voltage $V_{B2}$ between the anode 1108 and the second magnetron 1104. In some embodiments, a magnitude of the first voltage $V_{B1}$ may be substantially the same as a magnitude of the second voltage $V_{B2}$ ($V_{B1}=V_{B2}$), and when $V_{B1}=V_{B2}$, the voltage at node $V_B$ is referred to herein as $V_{combined}$ although it will be understood that the values are highly idealized, and $V_{B1}$ may not perfectly match $V_{B2}$ in practice.

Continuing with FIG. 13, the first period of time $t_1$ may be followed by a second period of time $t_2$. During the second period of time $t_2$, the system 1100 may be configured to cause the first power source 1140 and the second power source 1142 to apply an anode power having a voltage at the anode 1108 that is negative relative to the magnetrons 1102 and 1104. Of note, when the two power sources 1140, 1142 apply power to the anode 1108 simultaneously, the anode current is additive.

While the graphical depictions in FIG. 13 are highly idealized, an approximation of the powers and voltages may be provided. In some embodiments, the first voltage $V_{B1}$ may be between about 300 Volts and about 800 Volts. In some embodiments, the first voltage $V_{B1}$ may be at least 400 Volts. A magnitude of the second voltage $V_{B2}$ may be substantially equal to a magnitude of the first voltage $V_{B1}$. A root mean square or RMS may be taken to evaluate the voltage.

Figure 15:
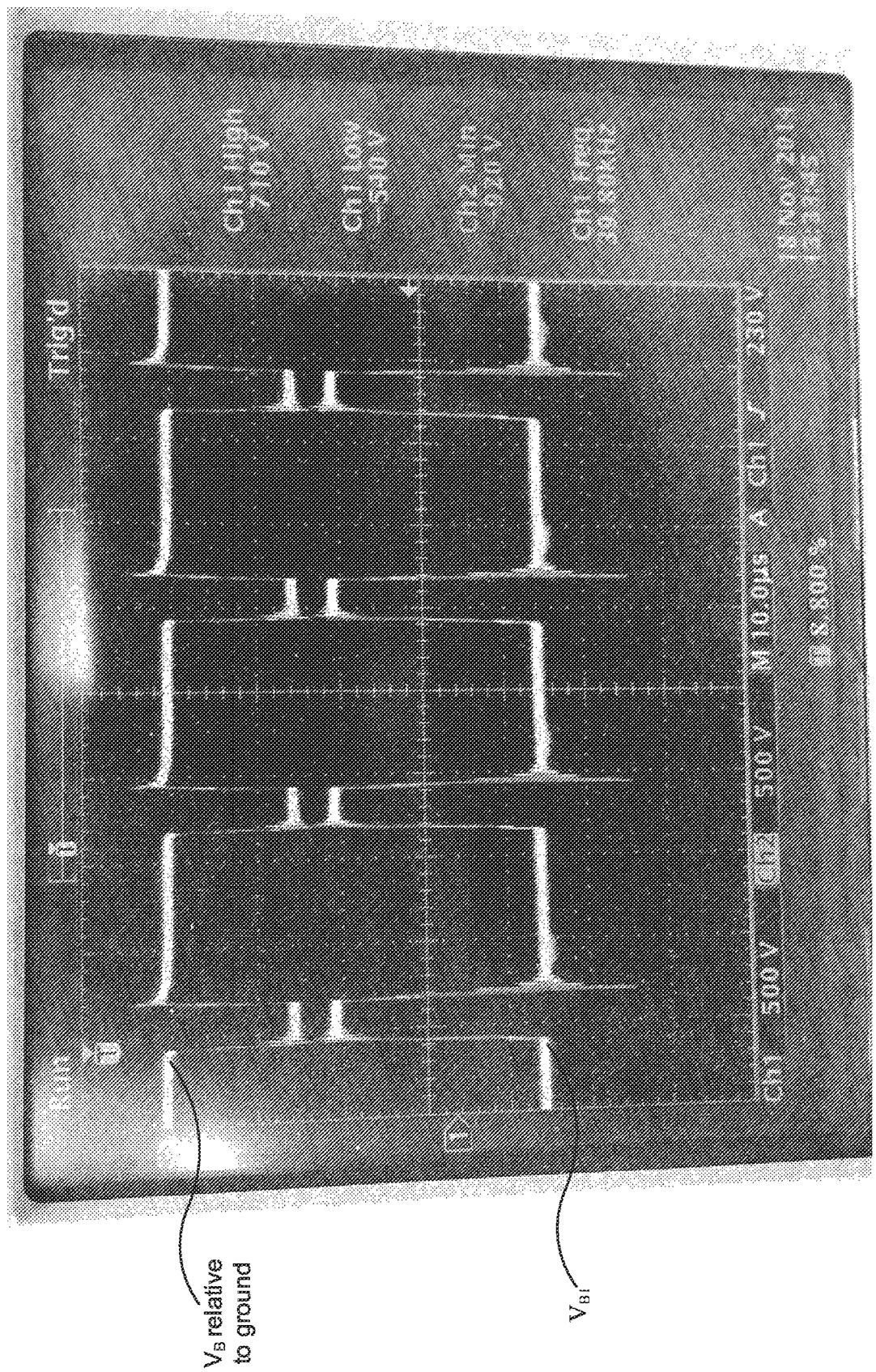
FIG. 15 is a graphical depiction of power supplied by the system depicted in FIG. 11.

It should also be noted that $V_{B1}$ and $V_{B2}$ represent the voltage applied to the anode 1108 relative to the first magnetron 1102 and second magnetron 1104, respectively. But the voltage at node $V_B$ may be measured relative to ground. With brief reference to FIG. 15, for example, shown is an oscilloscope illustrating a top trace representing the voltage of the anode, or $V_B$, relative to ground, while the bottom trace illustrates a voltage $V_{B1}$ applied to the first magnetron 1102 relative to the anode 1108. In some embodiments, $V_B$ relative to ground is at least 70% of a value Vsum, which is in an arbitrary summed voltage Vsum in a sputtering power applied for the first period of time t1. That is, the term "summed voltage Vsum" is not intended to mean that the system as a whole experiences a summed voltage, but rather that the first magnetron 102 may experience a voltage and the second magnetron 104 may experience a voltage, with the voltage being summed for the purpose of analysis. In some embodiments, $V_B$ relative to ground is at least 80% of Vsum.

Figure 14:
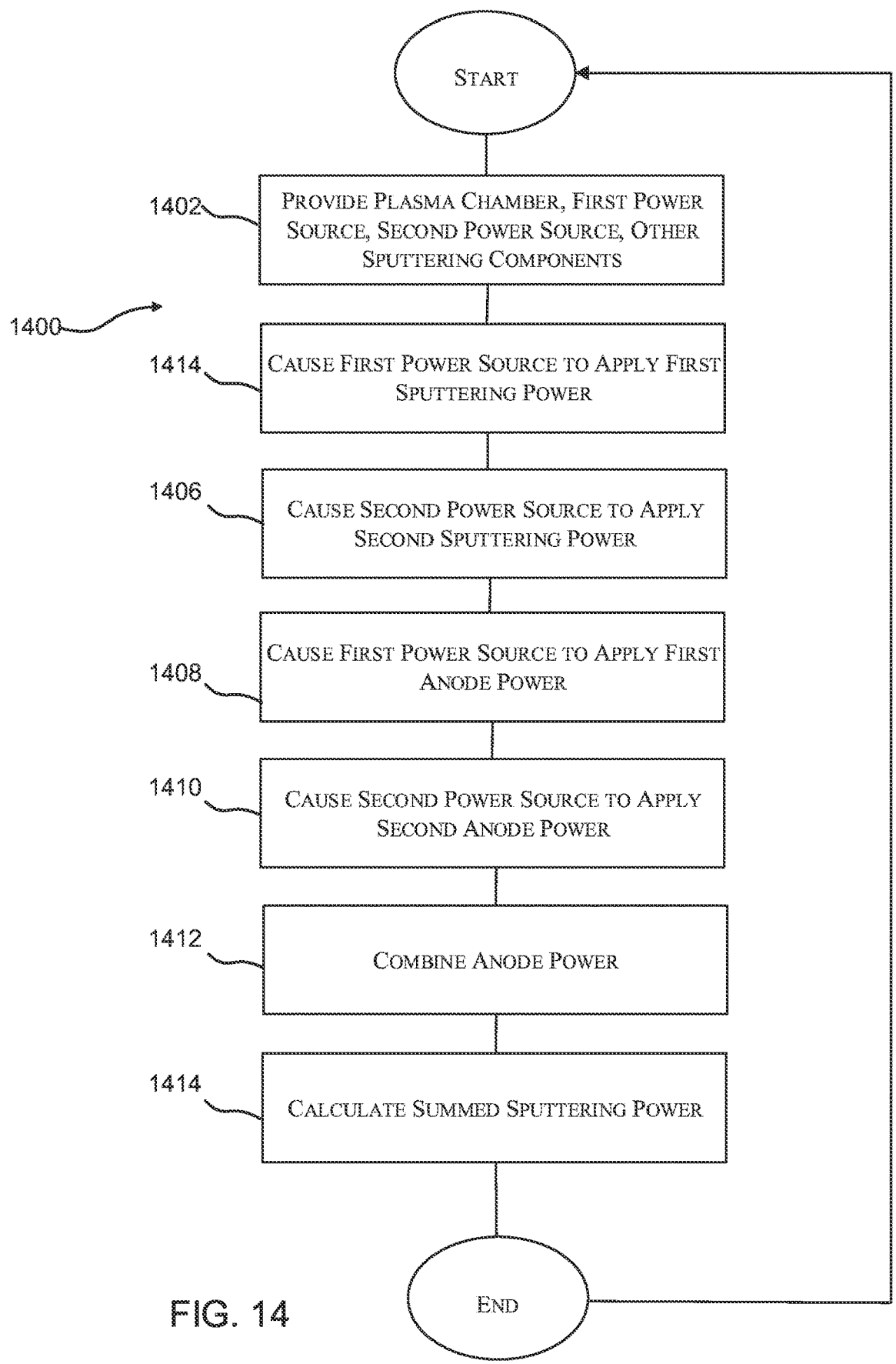
FIG. 14 is a flowchart depicting another method disclosed herein.

Referring now to FIG. 14, shown is a flowchart depicting another method 1400 of sputtering that may be executed by the system 1100. The method 1400 may include providing 1402 a plasma chamber, a first power source, a second power source, and other sputtering components. Providing 1402 may be achieved by providing a system such as system 100 described with reference to specific implementations in FIGS. 1-13. The method 1400 may include causing 1404 the first power source to apply a first sputtering power to the first magnetron for a first period of time. The method 1400 may also include causing 1406 the second power source to apply a second sputtering power to the second magnetron for the first period of time, the first sputtering power and the second sputtering power providing a summed sputtering voltage. In some embodiments, the method 1400 may include calculating 1414 one or more of a summed sputtering power, a summed sputtering voltage, and a summed sputtering current applied to the first magnetron and the second magnetron.

The method 1400 may also include causing 1408 the first power source to apply a first anode power to the anode for a second period of time following the first period of time. The method 1400 may also include causing 1410 the second power source to apply a second anode power to the anode for the second period of time, the first anode power and the second anode power providing a combined anode power.

The method 1400 may include combining 1412 an anode power to the anode such that the combined anode power, having a current and a voltage, has a voltage $V_B$ relative to ground having a magnitude of at least 80% of a magnitude of the summed sputtering voltage.

In method 1400, the first period of time (e.g., $t_1$) may be at least 80% of a sputtering cycle, the sputtering cycle comprised of the first period of time and the second period of time. In some embodiments, the first period of time is at least 70% of the sputtering cycle. In some embodiments, the combined anode voltage has a magnitude of at least 800 Volts. In some embodiments, the first period of time $t_1$ may be between 70% and 90% of the cycle, and the second period of time $t_2$ may be between 30% and 10% of the cycle. In some embodiments, the first period of time $t_1$ may be between 80% and 90% of the cycle, and the second period of time $t_2$ may be between 20% and 10% of the cycle. In some embodiments, the first period of time $t_1$ may be between 85% and 90% of the cycle, and the second period of time $t_2$ may be between 15% and 10% of the cycle.

In some embodiments, the first sputtering power has a voltage having a magnitude of at least 300 Volts, and the second sputtering power has a voltage having a magnitude of at least 300 Volts.

In some embodiments, the combined anode power has a current and a voltage, the voltage having a magnitude of at least 1000 Volts.

In some embodiments, the anode is a floating anode comprising a gas bar having a gas inlet and a plurality of gas outlets shaped to provide a Hollow Cathode Effect.

In some embodiments, the method 1400 includes causing a synchronizer to cause the first power source and the second power source to simultaneously apply power to the first magnetron and the second magnetron for the first period of time and to cause the first power source and the second power source to simultaneously apply power to the anode for the second period of time.

To determine basic functionality, the system 1100 and method 1400 previously described herein were tested using $TiO_x$ as the target material, 6.4 mTorr using 126 SCCM argon and 100 SCCM oxygen as the reactive gas, 4 kW of applied power per magnetron with a floating anode sitting between them, and a line speed of 10 inches per minute. Table 1 illustrates the results of the functionality test, establishing that the system 100 would operate.

TABLE 1

Functionality Test Observations at first plasma.

| Item | Voltage | Current |
|---|---|---|
| V1 (V of first magnetron 1102 to anode 1108) | −535 V | 7.2 A |
| V2 (V of second magnetron 1104 to anode 1108) | −565 V | 7.1 A |
| Voltage of Anode 1108 to Ground | 850 V | NA |
| Anode | −680 $V_{combined}$ | 2.2 A |
| Voltage of first magnetron 1102 to Ground | −720 V | NA |

The above functionality test verified that the system 1100 was functional substantially as envisioned, and was attempting to deliver full power to the anode 1108. Of note, an unforeseen result of the functionality test revealed that the anode power exhibited a current of just 2.2 Amperes, or about half of what was expected.

Applicant has determined that, because there was no magnetic enhancement on the anode 1108, it would take very high voltages to do any more work beyond heating the anode 1108, which was also found to be a desirable response. That is, $V_{combined}$ is high enough to result in a very low current at the anode 1108 in the functionality test. Moreover, because the current is additive, a current at the anode 1108 of just 2.2 Amperes indicates that a current approaching 0 is experienced at each of the first and second magnetrons 1102, 1104—another desirable result to prevent undesirable coating of the first and second magnetrons 1102, 1104 during an anode power pulse.

Beyond the functionality test, the system was tested under three other settings, described below under runs 1, 2, and 3. Benchmark runs 4 and 5 were also performed using a traditional AC sputtering system as described below. By measuring a film deposition thickness at the same given line speed, deposition rates could be calculated. The heat load or temperature of the substrate 1122 was also measured, as was the voltage and current at the magnetrons 1102, 1140 and anode 1108. Of note, the setup was run on a sputter-down machine with relatively small magnetrons, so process power was limited.

Figure 16:
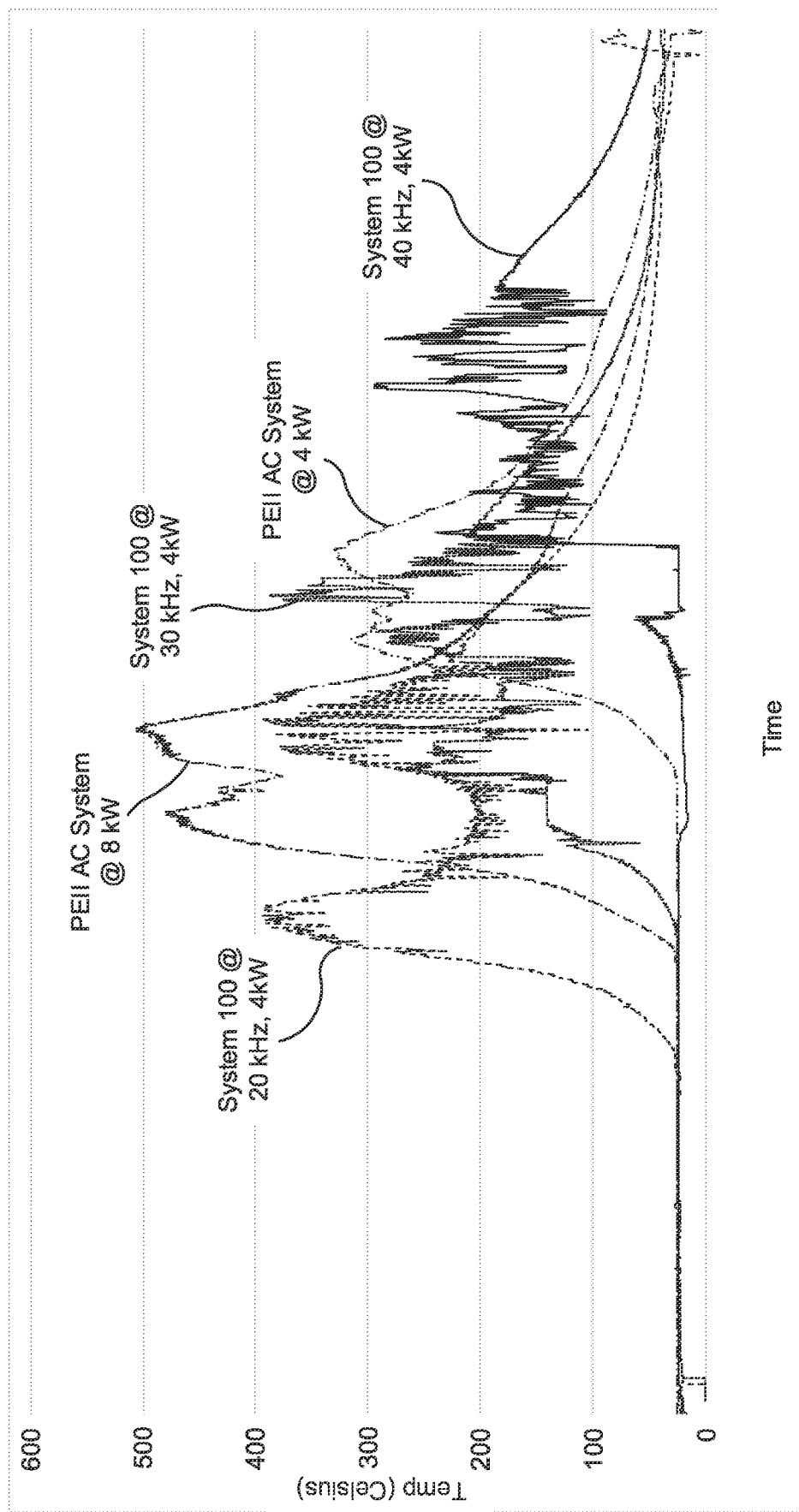
FIG. 16 is a graphical depiction of heat load test results, consistent with systems described herein, compared to traditional AC systems.

Turning now to FIG. 16, illustrating a summary of the heat load responses, a series of tests were performed at various frequencies, notably run 1 was at 20 kHz, run 2 was at 30 kHz, and run 3 was at 40 KHz with as much Side A ON time as possible, that is, with as much time of power application to the magnetrons.

To compare deposition rates and heat loads, the system 1100 was compared to a currently available Advanced Energy PEII AC power supply, illustrated at benchmark test runs 4 and 5.

With each run, a film thickness measurement was taken using a Dektak® profilometer, with a Sharpie® mark on the bare glass. Scrubbing the coated glass over the Sharpie mark removes the coating so a good thickness step could be obtained.

Also with each run, the heat load on the substrate was measured by a SuperMole, which is a circuit board encased by many heat shields with a type K thermocouple superglued to the glass substrate. The SuperMole took real-time temperature measurements through the plasma and the results were then downloaded and stored.

With simultaneous reference now to FIGS. 16-19, the 5 runs were completed, with all machine setups maintained as described above. The results of the 5 runs are described below.

TABLE 2

| Run 1. System 100 @ 4 kW, 20 KHz. | | | |
|---|---|---|---|
| DC Supply Settings | Power | Voltage | Current |
| 1$^{st}$ DC supply 1116 Settings | 4 kW | $V_1$ = 513 V | $I_1$ = 7.8 A |
| 2$^{nd}$ DC supply 1118 Settings | 4 kW | $V_2$ = 526 V | $I_2$ = 7.7 A |
| Side A Settings | Frequency | Side A | Side B  Boost |
| 1$^{st}$ bi-polar DC supply 1112<br>2$^{nd}$ bi-polar DC supply 1114 | 20 kHz | 90% | 10%  50% |
| Side B (Anode 1108) Settings | | Voltage | Current |
| 1$^{st}$ bi-polar DC supply 1112<br>2$^{nd}$ bi-polar DC supply 1114<br>Anode | | $V_3$ = 589 V<br>$V_4$ = 598 V<br>VB1 and VB2 not measured | $I_3$ = 2.8 A<br>$I_4$ = 3.4 A<br>$I_{combined}$ = 6.2 A |

TABLE 3

| Run 2. System 100 @ 4 kW, 30 KHz. | | | |
|---|---|---|---|
| DC Supply Settings | Power | Voltage | Current |
| 1$^{st}$ DC supply 1116 Settings | 4 kW | $V_1$ = 527 V | $I_1$ = 7.6 A |
| 2$^{nd}$ DC supply 1118 Settings | 4 kW | $V_2$ = 542 V | $I_2$ = 7.4 A |
| Side A Settings | Frequency | Side A | Side B  Boost |
| 1$^{st}$ bi-polar DC supply 1112 | 30 kHz | 85% | 15%  50% |

TABLE 3-continued

| Run 2. System 100 @ 4 kW, 30 KHz. | | |
|---|---|---|
| 2$^{nd}$ bi-polar DC supply 1114 | | |
| Side B (Anode 1108) Settings | Voltage | Current |
| 1$^{st}$ bi-polar DC supply 112<br>2$^{nd}$ bi-polar DC supply 114<br>Anode | $V_3$ = 637 V<br>$V_4$ = 647 V<br>VB1 and VB2 not measured | $I_3$ = 2.2 A<br>$I_4$ = 2.2 A<br>$I_{combined}$ = 4.4 A |

TABLE 4

| Run 3. System 100 @ 4 kW, 40 kHz. | | | |
|---|---|---|---|
| DC Supply Settings | Power | Voltage | Current |
| 1$^{st}$ DC supply 1116 Settings | 4 kW | $V_1$ = 545 V | $I_1$ = 7.3 A |
| 2$^{nd}$ DC supply 1118 Settings | 4 kW | $V_2$ = 552 V | $I_2$ = 7.2 A |
| Side A Settings | Frequency | Side A | Side B  Boost |
| 1$^{st}$ bi-polar DC supply 1112<br>2$^{nd}$ bi-polar DC supply 1114 | 40 kHz | 80% | 20%  50% |
| Side B (Anode 1108) Settings | | Voltage | Current |
| 1$^{st}$ bi-polar DC supply 1112<br>2$^{nd}$ bi-polar DC supply 1114<br>Anode | | $V_3$ = 678 V<br>$V_4$ = 680 V<br>VB1 and VB2 not measured | $I_3$ = 2.2 A<br>$I_4$ = 2.2 A<br>$I_{combined}$ = 4.4 A |

TABLE 5

| Run 4. Traditional AC System @ 4 kW. | | | |
|---|---|---|---|
| PEII Settings | Power | Voltage | Current |
| PEII AC Power Settings | 4 kW | 570 V | 7.6 A |

TABLE 6

| Run 5. Traditional AC System @ 8 kW. | | | |
|---|---|---|---|
| PEII Settings | Power | Voltage | Current |
| PEII AC Power Settings | 8 kW | 630 V | 14 A |

Figure 17:
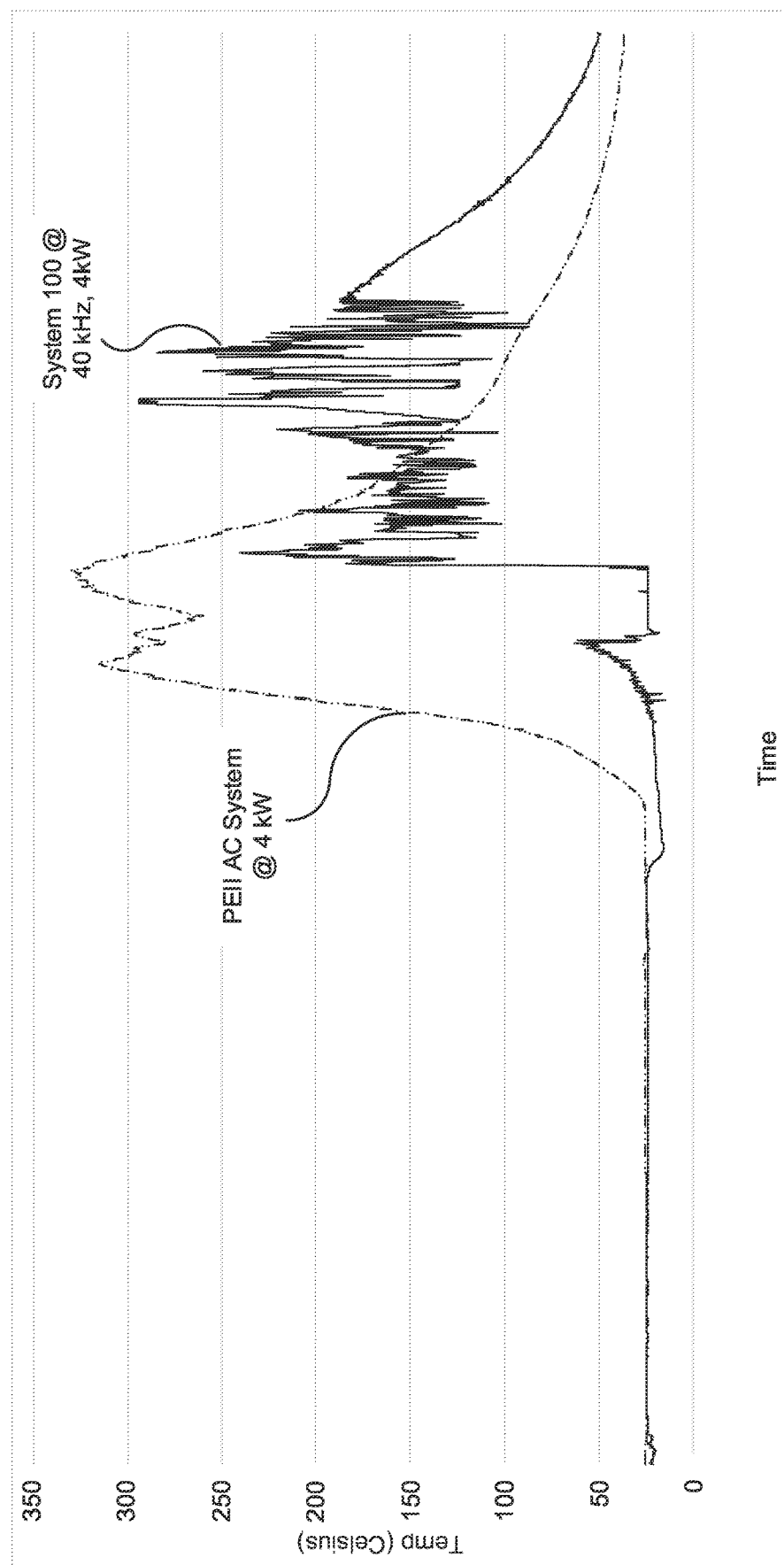
FIG. 17 is a graphical depiction of a heat load resulting from the use of a system described herein at 4 kW compared to a traditional AC system at 4 kW.
Figure 18:
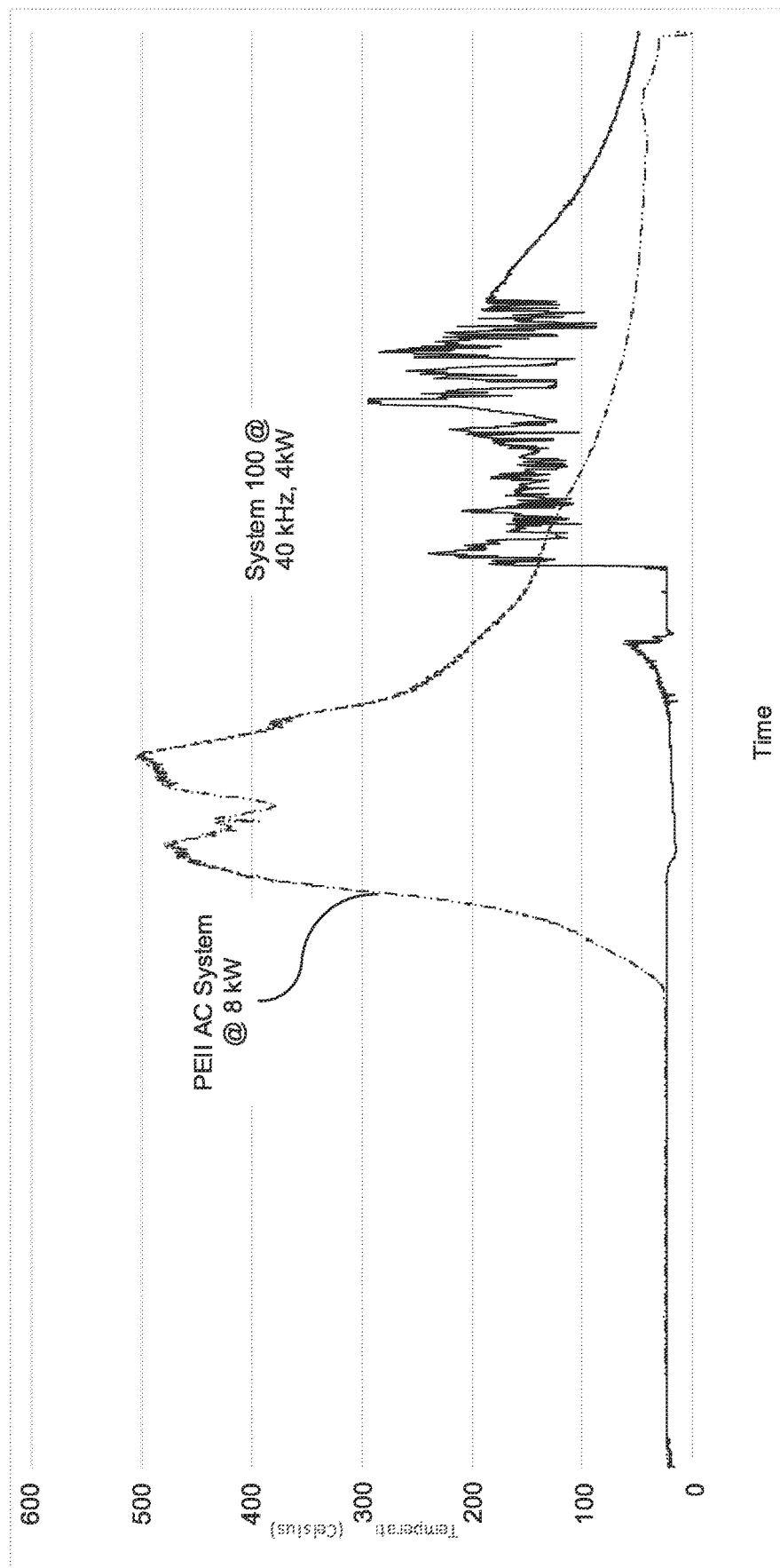
FIG. 18 is a graphical depiction of a heat load resulting from the use of a system described herein at 4 KW compared to a traditional AC system at 8 KW.
Figure 19:
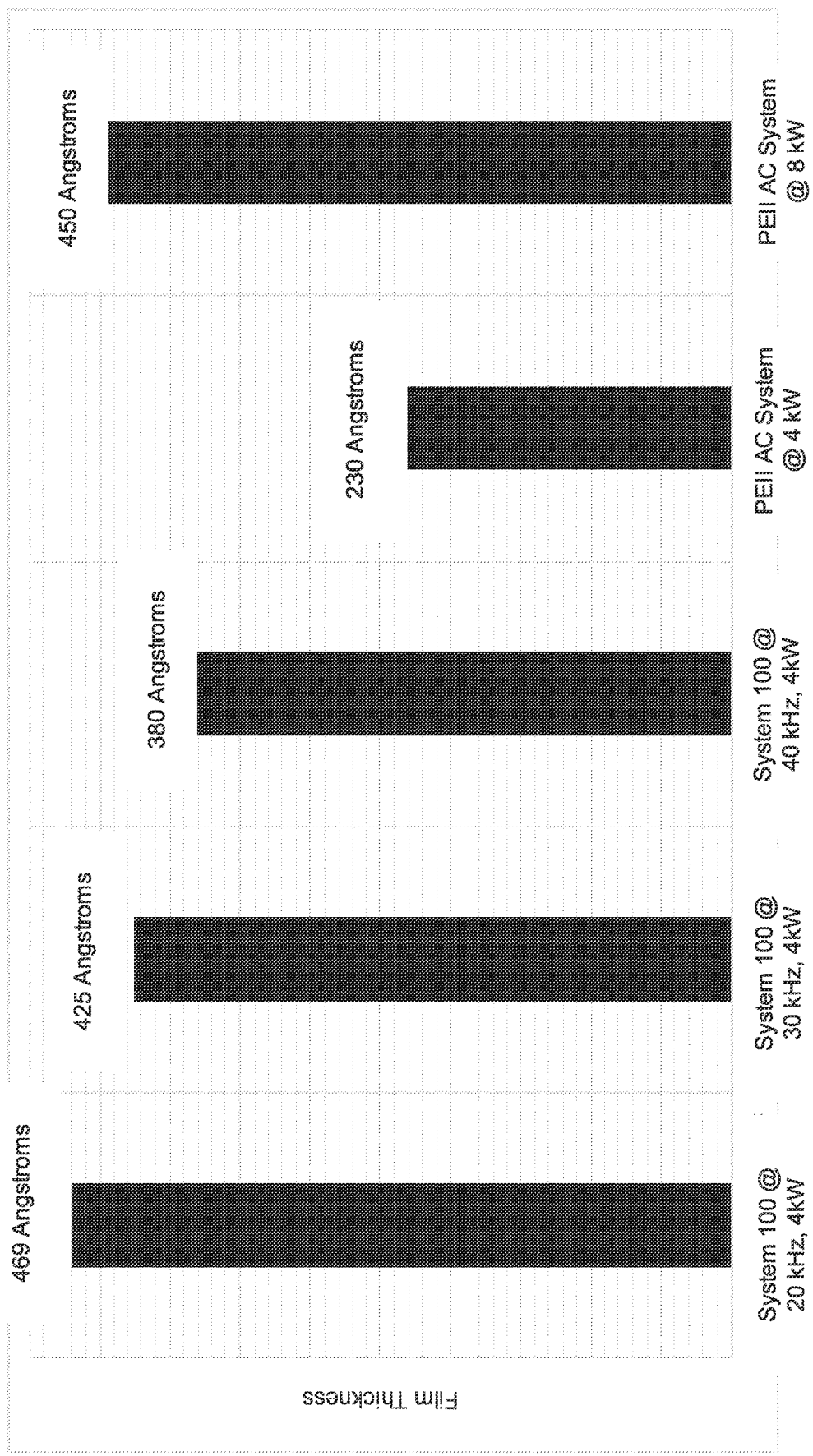
FIG. 19 is a graphical depiction of film thickness or deposition rates achieved using various settings of an exemplary system disclosed herein, compared to various traditional AC systems.

FIG. 17 illustrates the heat load results of the system 1100 running at 40 KHz and 4 KW, as compared to an AC system at 4 KW. FIG. 18 illustrates the heat load results of the system 1100 running at 40 kHz and 4 KW, as compared to an AC system at 8 KW. FIG. 19 illustrates the resulting film thickness for each of the 5 runs (runs 1-3 being test runs and runs 4-5 being benchmark tests of AC systems).

With reference now to FIGS. 17 and 19, FIG. 17 indicates that the system 1100 results in less heating (under 300 degrees Celsius verses over 300 degrees Celsius). Moreover, and with reference to tables 3 and 5, the system 1100 provides a combined current Icombined of 4.4 Amperes at a power of 4 KW, while an AC system at 4 KW provides a current of 7.6 Amperes. That is, at the same power wattage settings, the system 1100 causes the anode 1108 to experience significantly less current (4.4 Amperes verses 7.6 Amperes), resulting in a relatively hot anode, improving cleaning properties of the anode 1108, and yet maintaining a relatively cool substrate. In light of FIG. 9, the system 1100 at the same power settings of a traditional AC system results in a much improved deposition rate (over 350 Angstroms verses about 225 Angstroms), meaning that a processing facility may realize significant yields without damage to sensitive substrates, such as polyethylene.

With reference now to FIGS. 18 and 19, illustrating the system 1100 with the first and second bi-polar DC supplies 1112, 1114 operating at 40 kHz, and the first and second DC supplies 1116, operating at 4 kW per side, compared to a traditional PEII AC system running at 8 KW, it is noted that, although the traditional system resulted in a thicker film, the system 1100 resulted in a much lower heat load. That is, although the deposition rate was just slightly more with the traditional system, the heat load on the system 1100 was half as herein described. While this is interesting, it is not where a usual process engineer would be when an AC power or current limit is hit and more deposition rate is required. For example, if a sputtering zone is running at 90 KW and is hitting the 300 amp AC current limit a traditional system, the system 1100 as described herein could be used instead. Placing two power supplies 1140, 1142 that are 120 KW in place of a 120 KW AC delivery system would result in the dramatic differences illustrated in FIGS. 17 and 19. With the system 1100 as herein described, it is possible to push more power into the power-delivery system without breaching the inductive heating current limit. The system 1100 may improve production speeds, add deposition rates without adding cathode lids, use existing cathodes to their fullest extent, and keep substrates much cooler.

With reference to tables 3 and 6, one can see that the system 1100 provides a combined current Icombined of 4.4 Amperes at a power of 4 KW, while an AC system at 8 kW provides a current of 14 Amperes. Taken in light of FIG. 19, one can see that the system 1100 at 4 KW and 40 kHz results in a deposition rate that approaches that of a traditional AC system at twice the power, but resulting in significantly less current (4.4 Amperes verses 14 Amperes) and a much lower heat load (about 300 degrees Celsius verses over 500 degrees Celsius).

A close analysis of FIG. 19 reveals that using a first power supply 1140 and a second power supply 1142 as previously described herein increases the deposition rates as compared to a traditional AC type sputtering system at the same power. For example, the system 1100 running at 4 KW per side and 20 KHz results in a film thickness of 470 Angstroms, while the traditional PEII AC system at 4 KW results in a film thickness of just 230 Angstroms. To approach the deposition rates of the system 1100, a traditional AC system would have to apply more than 8 kW of power.

Put succinctly, Applicant has provided a system, method, and means for increasing the deposition rate while drastically reducing the heat load experienced by the substrate 1122 at the same or lower power as that of a traditional AC system, and the current experienced by the anode 1108 and magnetrons 1102, 1104, which, as previously described, was an unexpected result.

Returning now to FIG. 16, one can deduce that system 1100 may run at any number of frequencies, including 20, 30, and 40 kHz, or others and provide a much better Angstrom/substrate temperature profile consistently over traditional AC power delivery.

Figure 20:
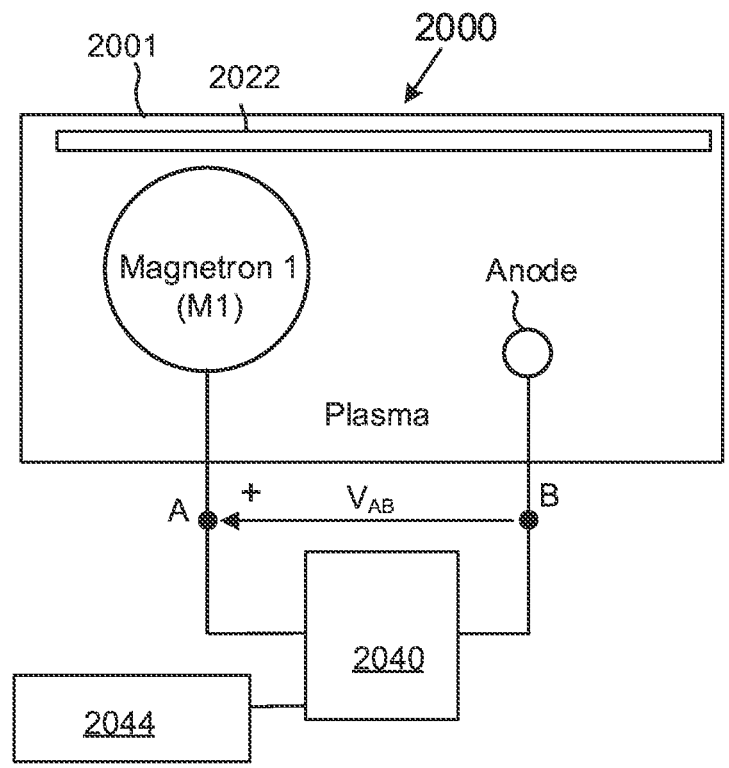
FIG. 20 depicts another embodiment utilizing a single magnetron with a dedicated anode.

Referring next to FIG. 20 shown is another embodiment in which a single magnetron M1 is utilized along with a dedicated anode. As shown, a plasma chamber 2001 encloses at least a magnetron M1 and an anode, and a power source 2040 is coupled to the magnetron M1 to apply a voltage $V_{AB}$ to the magnetron (relative to the anode) that alternates between positive and negative during each of multiple cycles. A controller 2044 is configured to control the first power source 2040 to apply the positive portion of the voltage $V_{AB}$ with a same magnitude as a negative portion of the voltage $V_{AB}$. The anode in this embodiment may be the plasma chamber 2001, or the anode may be floating (decoupled from the chamber 2001).

In operation, the depicted magnetron M1 may employ strong electric and magnetic fields to confine charged plasma particles close to the surface of a target (not shown in FIG. 20) associated with the magnetron M1. The anode generally functions to collect electrons from the plasma to maintain plasma neutrality as ions leave to bombard the target. Unlike prior art implementations, however, the anode in the present embodiment does not become coated with a deleterious insulating (e.g., dielectric) film, so the sputtering process is not adversely affected.

Figure 21:
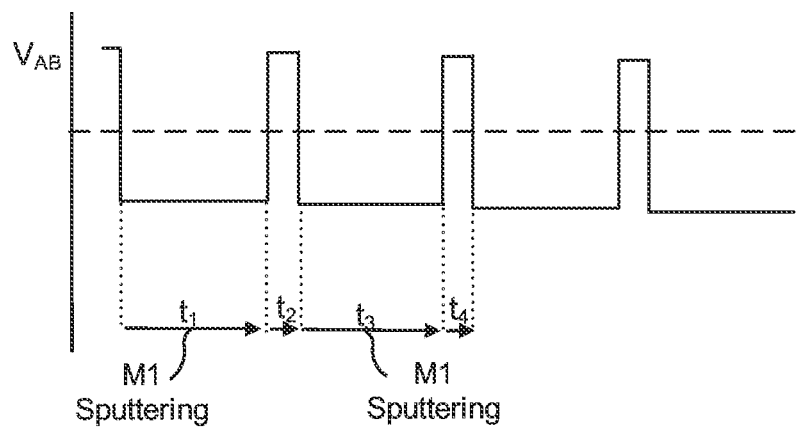
FIG. 21 is a timing diagram depicting a voltage of the system of FIG. 20 over multiple cycles.

More specifically, as shown with reference to FIG. 21, the positive portion of the voltage $V_{AB}$ at times $t_2$ and $t_4$ is applied with a magnitude and duration that results in a heating of the anode per se to keep the anode clean. But because the anode does not utilize the magnetic components (e.g., magnetic components of a magnetron) that generate magnetic fields (and hence impedance and heat), the positive portion of the voltage $V_{AB}$ at times $t_2$ and ta results in a low amount of heat being imparted to the substrate 2022.

Another aspect of the system 2000 is that the duty of the negative (sputtering) portion of the cycle depicted in FIG. 21 (at times $t_1$ and $t_3$) may be set by the controller 2044 to a high level such as levels greater than 50%, greater than, 60%, greater than 70%, greater than 80%, and even greater than 90%. During the positive portion of the of the voltage $V_{AB}$, power is reversed into the magnetron M1.

Figure 22:
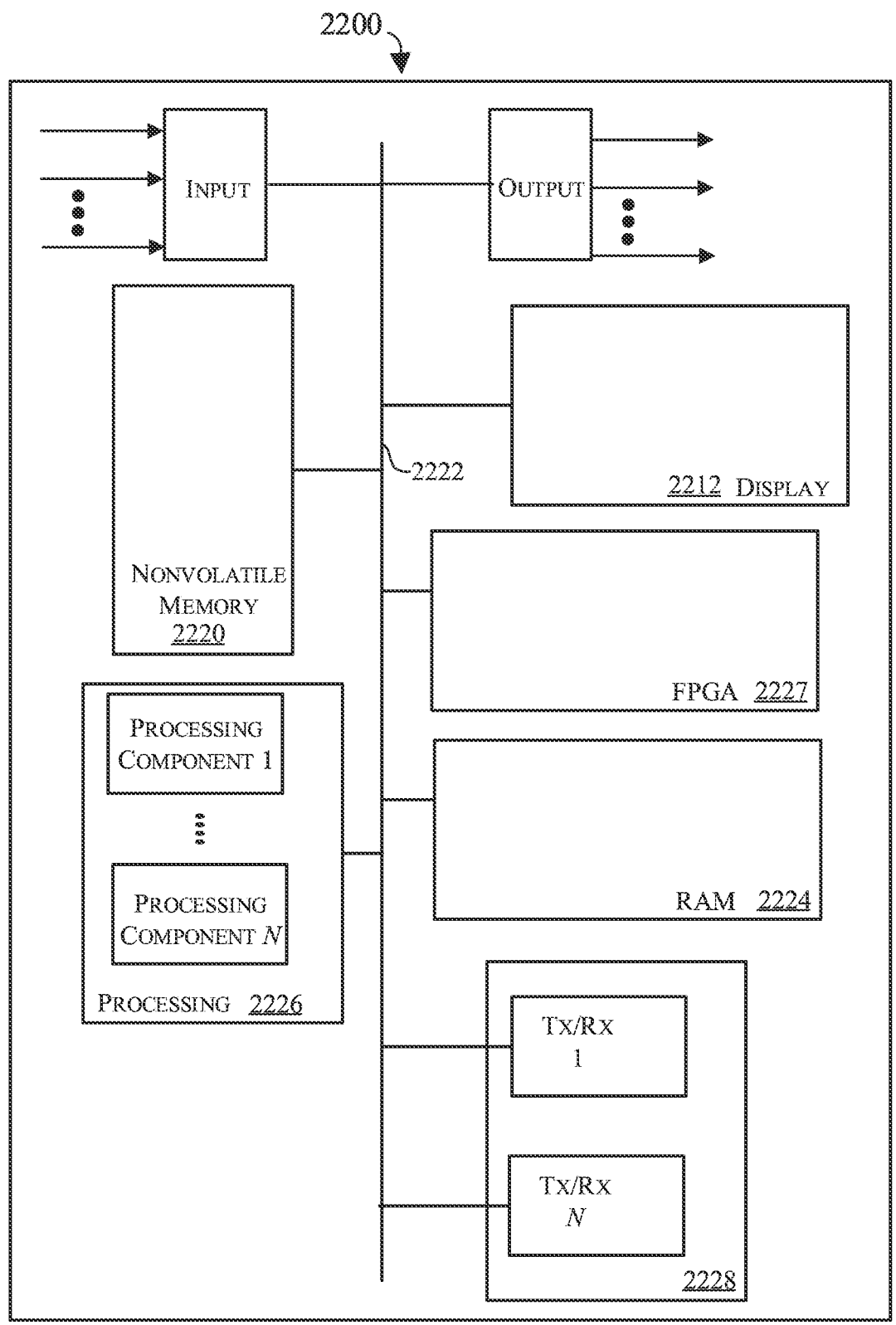
FIG. 22 is a block diagram illustrating aspects of hardware components that may be implemented in the systems described herein.

The methods (including the control methodologies) described in connection with the embodiments disclosed herein may be embodied directly in hardware, in processor executable instructions encoded in non-transitory processor readable medium, or in a combination of the two. Referring to FIG. 22 for example, shown is a block diagram depicting physical components that may be utilized to realize the controller 144, 1144 according to an exemplary embodiment. As shown, in this embodiment a display portion 2212 and nonvolatile memory 2220 are coupled to a bus 2222 that is also coupled to random access memory ("RAM") 2224, a processing portion (which includes N processing components) 2226, a field programmable gate array (FPGA) 2227, and a transceiver component 2228 that includes N transceivers. Although the components depicted in FIG. 22 represent physical components, FIG. 22 is not intended to be a detailed hardware diagram: thus, many of the components depicted in FIG. 22 may be realized by common constructs or distributed among additional physical components. Moreover, it is contemplated that other existing and yet-to-be developed physical components and architectures may be utilized to implement the functional components described with reference to FIG. 22.

This display 2212 generally operates to provide a user interface for a user, and in several implementations, the display 2212 is realized by a touchscreen display. In general, the nonvolatile memory 2220 is non-transitory memory that functions to store (e.g., persistently store) data and processor executable code (including executable code that is associated with effectuating the methods described herein). In some embodiments for example, the nonvolatile memory 2220 includes bootloader code, operating system code, file system code, and non-transitory processor-executable code to facilitate the execution of the methods described with reference to FIGS. 12 and 14.

In many implementations, the nonvolatile memory 2220 is realized by flash memory (e.g., NAND or ONENAND memory), but it is contemplated that other memory types may be utilized as well. Although it may be possible to execute the code from the nonvolatile memory 2220, the executable code in the nonvolatile memory is typically loaded into RAM 2224 and executed by one or more of the N processing components in the processing portion 2226.

The N processing components in connection with RAM 2224 generally operate to execute the instructions stored in nonvolatile memory 2220 to enable the power sources 140, 142, 1140, 1142 to achieve one or more objectives. For example, non-transitory processor-executable instructions to effectuate the methods described with reference to FIGS. 12 and 14 may be persistently stored in nonvolatile memory 2220 and executed by the N processing components in connection with RAM 2224. As one of ordinary skill in the art will appreciate, the processing portion 2226 may include a video processor, digital signal processor (DSP), graphics processing unit (GPU), and other processing components.

In addition, or in the alternative, the FPGA 2227 may be configured to effectuate one or more aspects of the methodologies described herein (e.g., the methods described with reference to FIGS. 12 and 14). For example, non-transitory FPGA-configuration-instructions may be persistently stored in nonvolatile memory 2220 and accessed by the FPGA 2227 (e.g., during boot up) to configure the FPGA 2227 to effectuate the functions of the controller 144, 1144.

The input component operates to receive signals that are indicative of one or more aspects of the power applied to the electrodes (e.g., magnetrons and/or the anodes). The signals received at the input component may include, for example, voltage, current, and/or power. The output component generally operates to provide one or more analog or digital signals to effectuate an operational aspect of the first and/or second power sources 140, 142, 1140, 1142. For example, the output portion may be a signal to cause the first power source 112, 1112 and/or second power source 114, 1114 to effectuate some of the methodologies described with reference to FIGS. 12 and 14. In some embodiments, the output component operates to adjust a frequency and duty of the first and/or second power source 140, 142, 1140, 1142.

The depicted transceiver component 2228 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. A pulsed power system, comprising:
   a first power source coupled to a first power lead and a second power lead, the first power source configured to apply a first voltage at the first power lead that alternates between positive and negative relative to the second power lead during each of multiple cycles;
   a second power source coupled to a third power lead and the second power lead, the second power source configured to apply a second voltage to the third power lead that alternates between positive and negative relative to the second power lead during each of the multiple cycles; and
   a controller configured to control the first power source and the second power source to phase-synchronize the first voltage with the second voltage, so both, the first voltage and the second voltage, are simultaneously negative during a portion of each cycle and simultaneously positive relative to the second power lead during another portion of each cycle, wherein the first voltage at the first power lead and the second voltage at the third power lead are simultaneously negative relative to the second power lead at least 70 percent of a time over the multiple cycles.

2. The system of claim 1, wherein the controller is configured to control the first power source and the second power source, so both, the first voltage and the second voltage are simultaneously negative relative to the second power lead at least 80 percent of a time over the multiple cycles.

3. The system of claim 1, wherein:
   the controller includes a processor, and the controller is configured with a non-transitory memory comprising non-transitory instructions executable by the processor.

4. The system of claim 1, wherein:
   the controller includes a field programmable gate array, and the controller is configured with a non-transitory memory including non-transitory instructions accessible by the field programmable gate array to configure the field programmable gate array.

5. The system of claim 1, wherein:
   the first power source includes a first direct current power supply coupled to a first bi-polar controllable pulsed direct current power supply, the first bi-polar controllable pulsed direct current power supply is configured to provide an alternating direct current power to the first power lead and the second power lead; and
   the second power source comprises a second direct current power supply coupled to a second bi-polar controllable pulsed direct current power supply, the second bi-polar controllable pulsed direct current power supply is configured to provide an alternating direct current power to the third power lead and the second power lead.

6. A non-transitory memory including non-transitory instructions that are at least one of executable by a processor to execute a method and accessible by a field programmable gate array to configure the field programmable gate array to execute the method, the method comprising:
   causing a first power source to apply a first voltage between first power lead and a second power lead, the first voltage at the first power lead alternates between positive and negative relative to the second power lead in a plasma chamber over multiple cycles;
   causing a second power source to apply a second voltage between a third power lead and the second power lead, the second voltage at the third power lead alternates between positive and negative relative to the second power lead over the multiple cycles; and
   causing the first power source and the second power source to phase-synchronize the first voltage with the second voltage, so both, the first voltage and the second voltage are simultaneously negative and simultaneously positive relative to the second power lead over the multiple cycles, wherein the voltages at the first power lead and the third power lead relative to the second power lead are negative at least 70 percent of a time over the multiple cycles.

7. The non-transitory memory of claim 6, wherein:
the voltages at the first power lead and the third power lead relative to the second power lead are negative at least 80 percent of a time over the multiple cycles.

8. The non-transitory memory of claim 6, wherein:
the voltages at the first power lead and the third power lead relative to the second power lead are negative between 70 and 90 percent of a time over the multiple cycles.

9. The non-transitory memory of claim 6, wherein:
the first voltage has a positive magnitude that is the same as a negative magnitude of the first voltage; and
the second voltage has a positive magnitude that is the same as a negative magnitude of the second voltage.

10. A pulsed power sputtering system, comprising:
a plasma chamber enclosing at least a first electrode, a second electrode, and a third electrode;
means for applying a first voltage at the first electrode that alternates between positive and negative relative to the second electrode during each of multiple cycles;
means for applying a second voltage to the third electrode that alternates between positive and negative relative to the second electrode during each of the multiple cycles; and
means for phase-synchronizing the first voltage with the second voltage, so both, the first voltage and the second voltage are simultaneously negative during a portion of each cycle and simultaneously positive relative to the second electrode during another portion of each cycle, wherein the first voltage and the third voltage are simultaneously negative relative to the second electrode at least 70 percent of a time over the multiple cycles.

11. The system of claim 10, wherein:
the means for phase-synchronizing comprises means for phase-synchronizing the first voltage with the second voltage so the first voltage and the third voltage are simultaneously negative relative to the second electrode at least 80 percent of the time over the multiple cycles.

12. The system of claim 10, wherein:
the means for phase-synchronizing comprises means for phase-synchronizing the first voltage with the second voltage so the first voltage and the third voltage are simultaneously negative relative to the second electrode between 70 and 90 percent of a time over the multiple cycles.

13. The system of claim 10 comprising:
means for applying, with a first power source, the first voltage at the first electrode that alternates between positive and negative relative to the second electrode
wherein a magnitude of the positive and negative portions of each of the multiple cycles of the first voltage is the same; and
means for applying, with a second power source, the second voltage at the third electrode that alternates between positive and negative relative to the second electrode wherein a magnitude of the positive and negative portions of each of the multiple cycles of the second voltage is the same.

* * * * *